(12) United States Patent
Liu

(10) Patent No.: US 7,696,077 B2
(45) Date of Patent: Apr. 13, 2010

(54) BOTTOM ELECTRODE CONTACTS FOR SEMICONDUCTOR DEVICES AND METHODS OF FORMING SAME

(75) Inventor: Jun Liu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 780 days.

(21) Appl. No.: 11/487,209

(22) Filed: Jul. 14, 2006

(65) Prior Publication Data

US 2008/0014733 A1    Jan. 17, 2008

(51) Int. Cl.
*H01L 21/44* (2006.01)
(52) U.S. Cl. .......... 438/597; 438/95; 438/238; 257/3
(58) Field of Classification Search .......... 438/95, 438/238; 257/3
See application file for complete search history.

(56) References Cited

U.S. PATENT DOCUMENTS

| | | | |
|---|---|---|---|
| 6,597,009 B2 | 7/2003 | Wicker | 257/4 |
| 6,764,894 B2 * | 7/2004 | Lowrey | 438/238 |
| 6,797,979 B2 | 9/2004 | Chiang et al. | 257/4 |
| 7,364,937 B2 * | 4/2008 | Lowrey | 438/95 |
| 7,495,946 B2 * | 2/2009 | Gruening-von Schwerin et al. | 365/148 |

* cited by examiner

*Primary Examiner*—Thanh V Pham
*Assistant Examiner*—Caleb Henry

(57) ABSTRACT

Bottom electrode contact structures for a semiconductor assembly and a method for forming same are described. An exemplary semiconductor device comprises electrode contact structures in a phase change memory device. The phase change memory device comprising a phase change cell is made up of a bottom electrode contact structure comprising a phase change material liner connecting between a conductive top electrode and a conductive bottom electrode where the resulting ultra-small contacts are determined by the intersection of the sidewall bottom electrode and the phase change liner.

6 Claims, 19 Drawing Sheets

BOTTOM ELECTRODE CONTACTS FOR SEMICONDUCTOR DEVICES AND METHODS OF FORMING SAME

FIELD OF THE INVENTION

This invention relates to semiconductor structures and semiconductor fabrication methods to form the semiconductor structures and, more particularly, to a phase change cell memory device and methods for forming same.

BACKGROUND OF THE INVENTION

There are many different memory devices available for use in electronic systems. The type of memory device chosen for a specific application depends largely upon what features of the memory are best suited to perform the particular function. For instance, dynamic random access memories (DRAMs) and static random access memories (SRAMs) are used to temporarily store program information and data "actively" being used by a microprocessor or other control device. To date, dynamic random access memories have been the most commonly used RAM for electronic applications. Random access memories tend to provide greater storage capability and programming options and cycles than read only memories, but they must be continually powered in order to retain their content. Most dynamic random access memories store data in the form of charged and discharged capacitors contained in an array of memory cells. Such memory cells, however, are volatile in that the stored charges will dissipate after a relatively short period of time because of the natural tendency of an electrical charge to distribute itself into a lower energy state. For this reason, most dynamic random access memories must be periodically refreshed, that is, the stored value must be rewritten to the cells, for example, every 100 milliseconds in order to retain the stored data in the memory cells. Even SRAMs, which do not require refreshing, will retain stored data only as long as power is supplied to the memory device. When the power supply to the memory device is turned off, the data is lost.

Efforts have been underway to create a commercially viable memory device that is programmable, randomly accessed, and nonvolatile. To this end, various implementations of such nonvolatile random access memory devices are presently being developed which store data in a plurality of memory cells by structurally, chemically, or magnetically changing the resistance across the memory cells in response to predetermined voltages respectively applied to the memory cells. Examples of such variable resistance memory devices include those based on polymers, perovskites, doped amorphous silicon, magnetic devices, and chalcogenide glass.

Resistance variable memory is a RAM that has electrical resistance characteristics that can be changed by external influences. The basic component of a resistance variable memory cell is a variable resistor. The variable resistor can be programmed to have high resistance or low resistance (in two-state memory circuits), or any intermediate resistance value (in multi-state memory circuits). The different resistance values of the resistance variable memory cell represent the information stored in the resistance variable memory circuit. The advantages of resistance variable memory are the simplicity of the circuit, leading to smaller devices, the non-volatile characteristic of the memory cell, and the stability of the memory states. The resistance variable memories that are being researched and developed include but not limited to Magnetic RAM (MRAM), Oxide RAM and Phase Change RAM (PCRAM). Among these different resistance variable memory technologies, PCRAM is one of the most promising candidates for next generation memory technology due to its various advantages such as high density, high speed, better scalability, low cost and low power.

Phase change memory technology utilizes a thermally induced reversible structural phase change between amorphous and polycrystalline states of the cell material. The rapid and reversible phase change gives rise to a change of cell material resistance, which can be measured electrically by the read operation. The amorphous state has a higher resistivity, while the polycrystalline state has a lower resistivity. Both phase states are nonvolatile and can retain their states at room temperature or elevated temperatures (up to 85 C) up to 10 years. The phase change is accomplished by Joule heating the cell material with a set or rest programming current pulse. To switch the cell material or a portion of cell material from low-resistivity polycrystalline state to high-resistivity amorphous state, a short but large RESET pulse is applied to heat up the cell above the material meting point. Subsequently the molten cell material is rapidly cooled down by thermal conduction through surrounding material and is quenched into a solid state that retains the disorder inherent in the molten state, which is termed amorphous state without long range order. The cooling rate has to be larger than $10^{11}$ K/s for the quenching to be effective. To switch the cell from amorphous state back to the low-resistivity stable polycrystalline state, a longer but lower SET pulse is applied to raise the cell material temperature to above its crystallization temperature but below its melting temperature. The SET pulse has to be sufficiently longer than the material crystallization time to ensure the crystallization process is complete.

Since the cell needs to be heated up above the melting temperature within a very short time to reset the memory, it is necessary to supply a sufficiently large RESET current to the memory cell. The requirement of large RESET current is one of the biggest issues with phase change memory, which can be of the order of 1 mA for the state-of-the-art phase change memory technology. Because of the large RESET current requirement, large access transistors and large cell size are implemented in the current phase change memory design. The cell size is larger than 16 $f^2$ if a CMOS MOSFET is used as the access transistor, while it is slightly smaller at 10 $f^2$ if a bipolar transistor is used as the access transistor, where f is the minimum line width of the process node, even though the cell size can be smaller if a cross point diode-accessed configuration is utilized for the cell circuit design. The large cell size impedes low cost large scale phase change memory integration to compete with other existing non-volatile memory such as NOR or NAND flash. On the other hand, phase change memory can be easily scaled down to smaller feature size, with functionality demonstrated even down to 5 nm. The operational mechanism and underlying physical principles dictates the scaling rule of phase change memory, in which the RESET current can scale inversely to the bottom electrode contact area. In order to reduce the transistor and cell size and increase the memory data density, the development of the phase change memory technology in the past has mostly focused on the reduction of the programming current requirement by reducing the contact area between the bottom electrode and the phase change cell. The present invention addresses the desire to reduce the programming current requirement for a phase change cell by restructuring the contact area between the cell and bottom electrode by means of a novel process technique to achieve an effective ultra-small contact area that is inaccessible with the current photolithography or spacer technologies.

The present invention describes various bottom electrode contact structures for a semiconductor device and in particular a phase change memory semiconductor device and methods to form same, that reduces set and reset current requirements by reducing the effective contact area between the cell and bottom electrodes of the phase change cell.

DETAILED DESCRIPTION OF THE INVENTION

Figure 36:
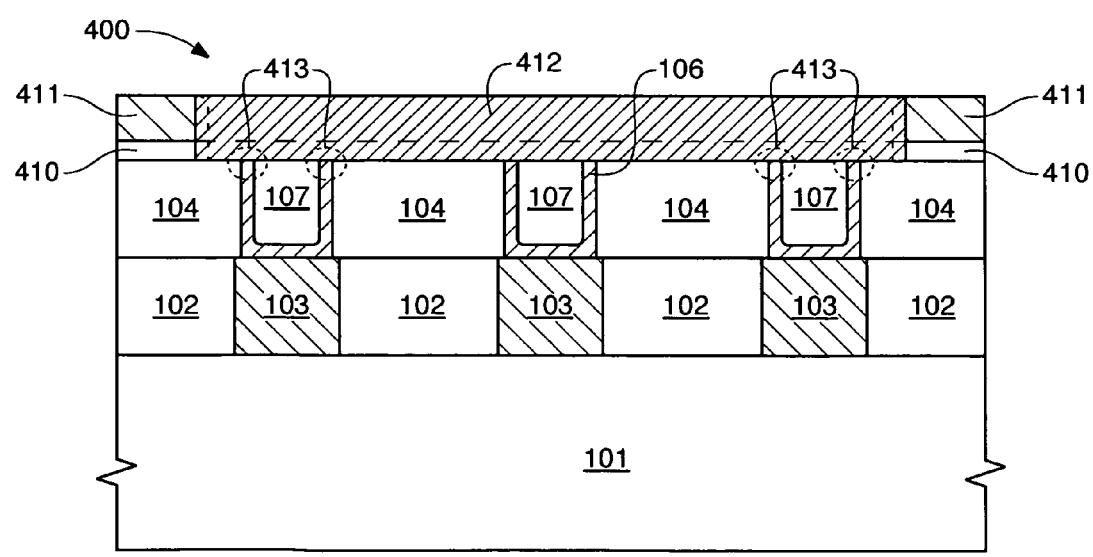
Figure 37:
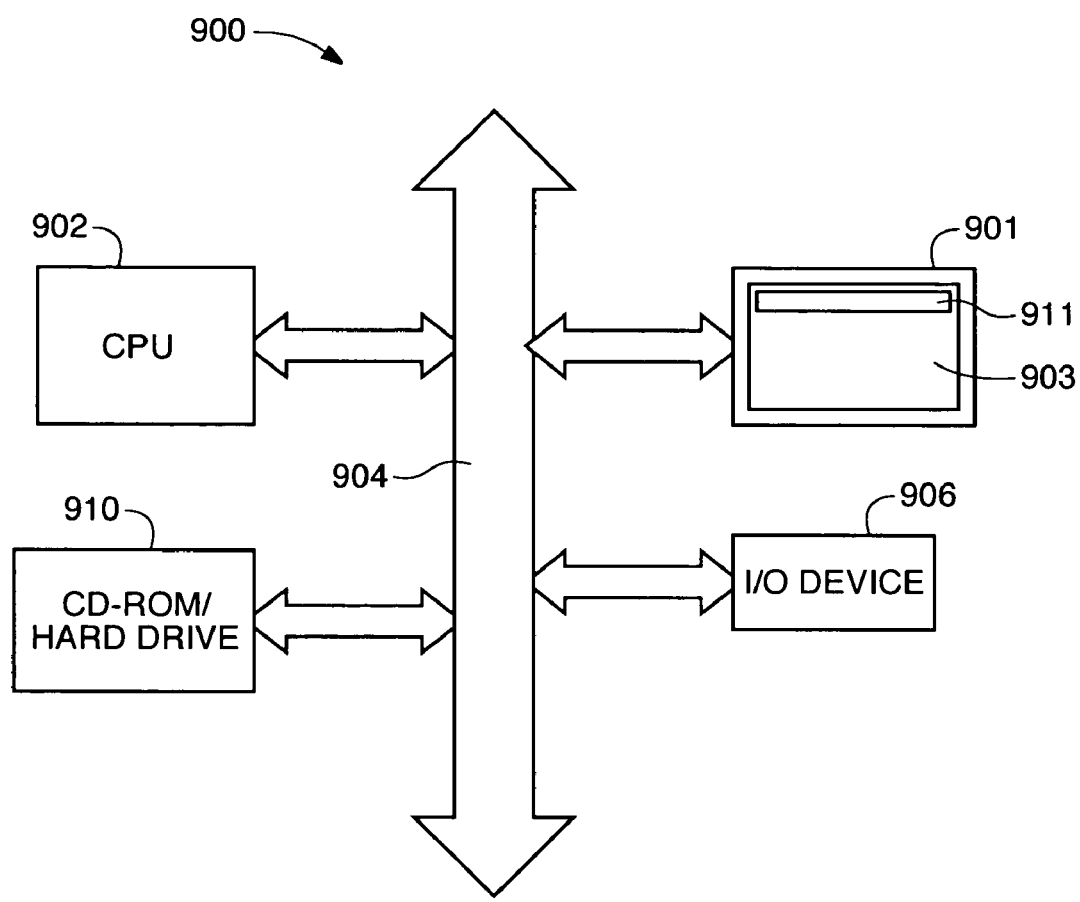
FIG. 37 represents a system used to employ any one of the exemplary implementations of the present invention.

Exemplary implementations of the present invention are directed to a bottom electrode contact structure for a phase change memory device and the process for forming same, as depicted in FIGS. 1-36 and as employed in a system as depicted in FIG. 37.

Figure 1:
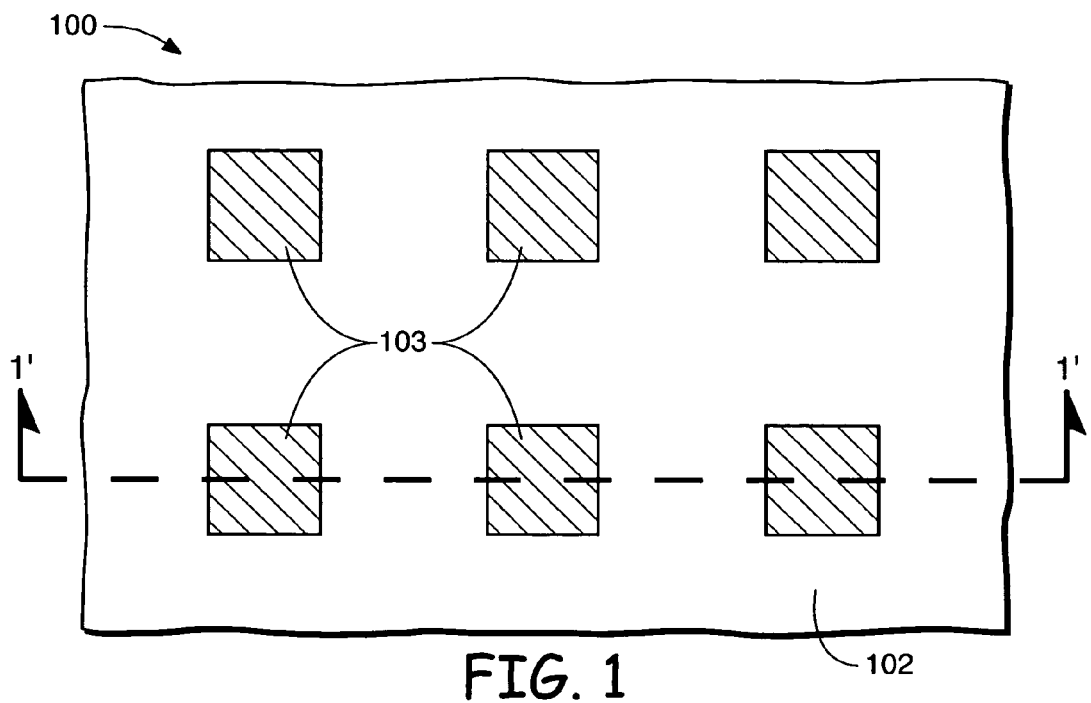
FIG. 1, a top-down view of a substrate assembly and FIG. 2, a corresponding cross sectional view, show conductive plugs formed in a substrate assembly.
Figure 2:
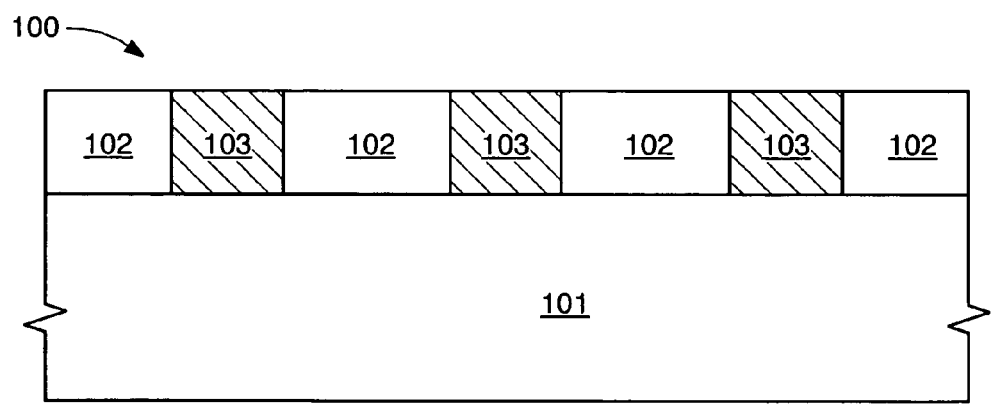

Referring now to a first exemplary implementation of the present invention as depicted in FIGS. 1-12, top-down view, FIG. 1, and corresponding cross sectional view, FIG. 2 (taken through line 1'-1' of FIG. 1), depict a semiconductor assembly 100 showing a conventional structure comprising conductive plugs 103 formed in dielectric material 102 on substrate 101, such as semiconductor substrate (e.g. a silicon wafer) formed by fabrication techniques known to one skilled in the art.

Figure 3:
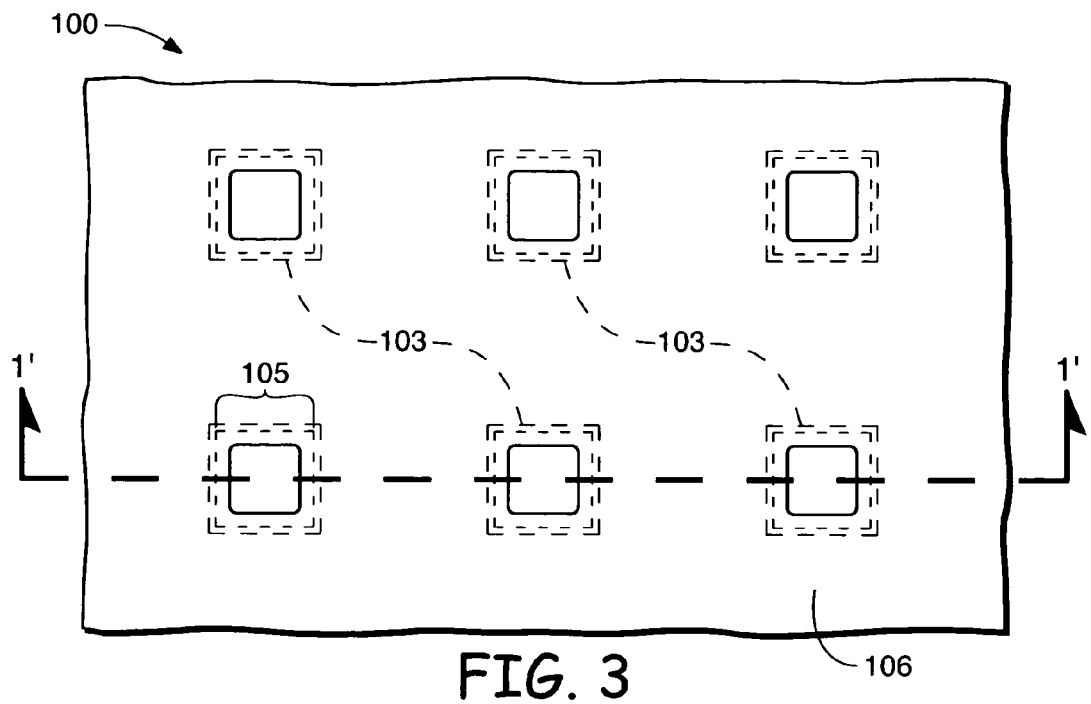
FIG. 3 and FIG. 4, a top-down view and a corresponding cross sectional view in reference to FIG. 1, and FIG. 2, respectively, show the substrate assembly following a deposition of a dielectric layer (i.e., nitride) and the formation of vias (openings) on top of the conductive plugs followed by the deposition of a conformal conductive layer.
Figure 4:
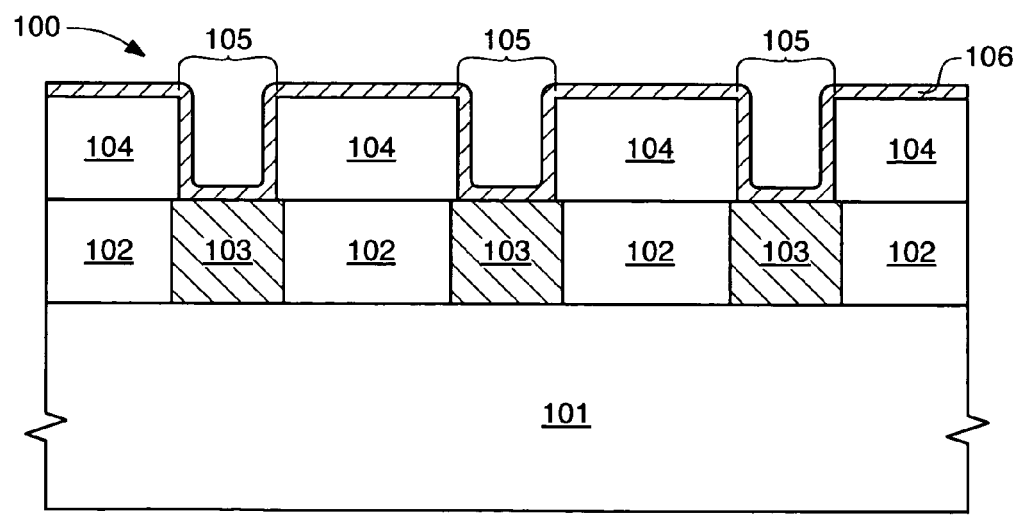

Top-down view, FIG. 3, and corresponding cross sectional view, FIG. 4 (taken through line 1'-1' of FIG. 3), depict the semiconductor assembly 100 after a deposition of a dielectric layer (i.e., nitride) 104 over the assembly, into which vias 105 are patterned and etched to expose the upper surface of conductive plugs 103. Next, a thin conformal layer (approximately 100 Å in thickness is desired) of conductive material 106, such as TiN, is deposited over the semiconductor assembly 100 such that conductive material 106 coats the bottom of vias 105, thus making contact to the upper surface of conductive plugs 103 as well as lining the sidewalls of the patterned dielectric 104.

Figure 5:
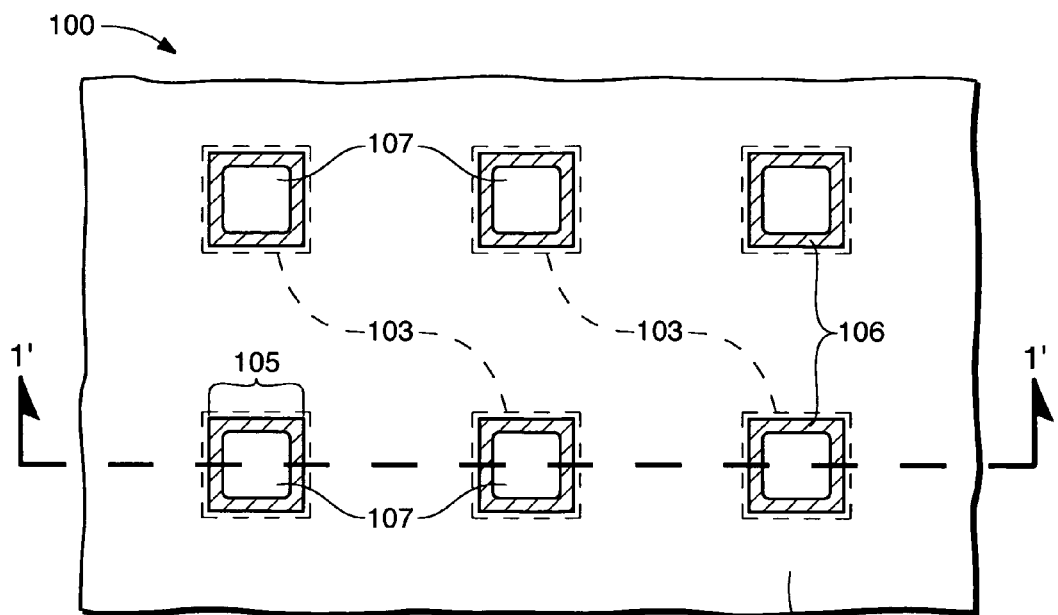
FIG. 5 and FIG. 6, a top-down view and a corresponding cross sectional view in reference to FIG. 3, and FIG. 4, respectively, show the substrate assembly following a deposition of oxide to fill the vias followed by a planarization step to form conductive liners along the walls of the vias, with the vias filled with oxide.
Figure 6:
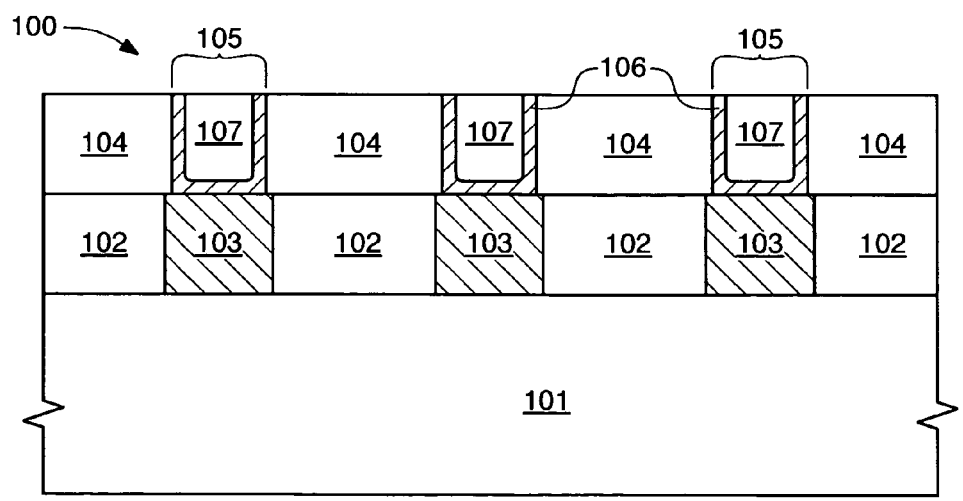

Top-down view, FIG. 5, and corresponding cross sectional view, FIG. 6 (taken through line 1'-1' of FIG. 5), depict the semiconductor assembly 100 after a deposition of oxide material 107 to fill vias 105. A planarization step is then performed to form conductive liners 106 from previously formed conductive material 106 (seen in FIG. 4), along the walls of vias 105 and to planarized the oxide material and thus create vias 105 filled with planarized oxide 107. Conductive liner 106 also forms the bottom electrodes for each phase change memory cell.

Figure 7:
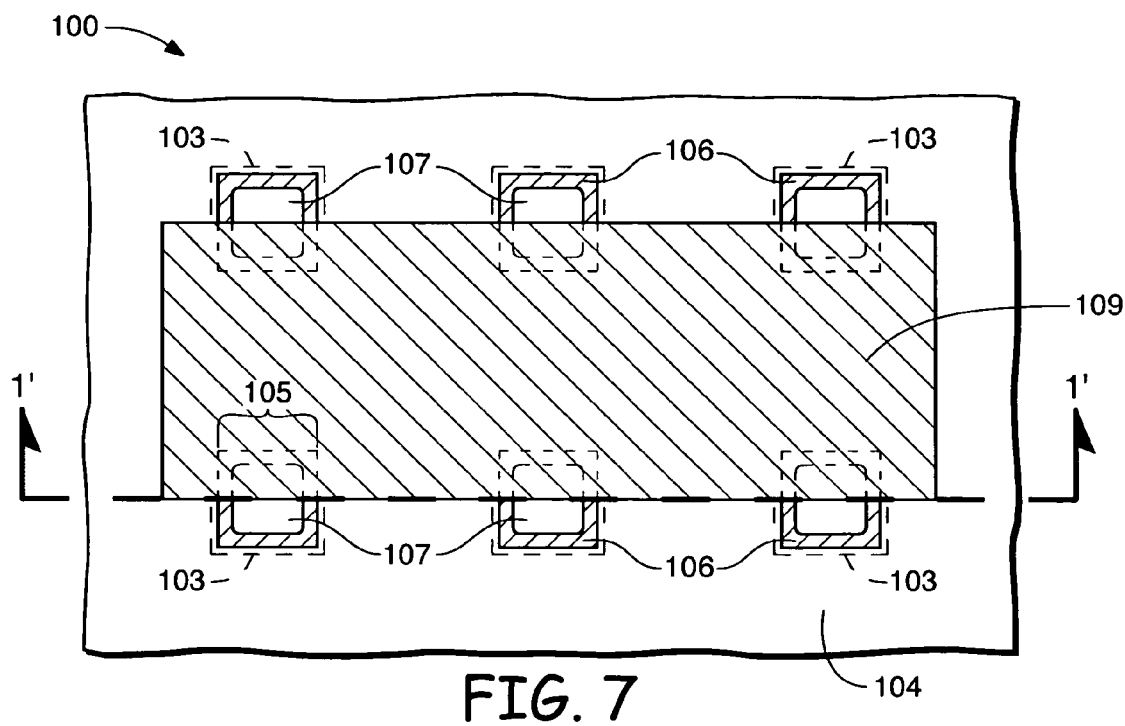
FIG. 7 and FIG. 8, a top-down view and a corresponding cross sectional view in reference to FIG. 5, and FIG. 6, respectively, show the substrate assembly after a deposition of a layer of dielectric material, a deposition of a metal-one layer and a patterning of the dielectric layer and the metal-one layer such that each patterned stack of the dielectric material and the metal-one layer make contact with two rows of bottom electrodes.
Figure 8:
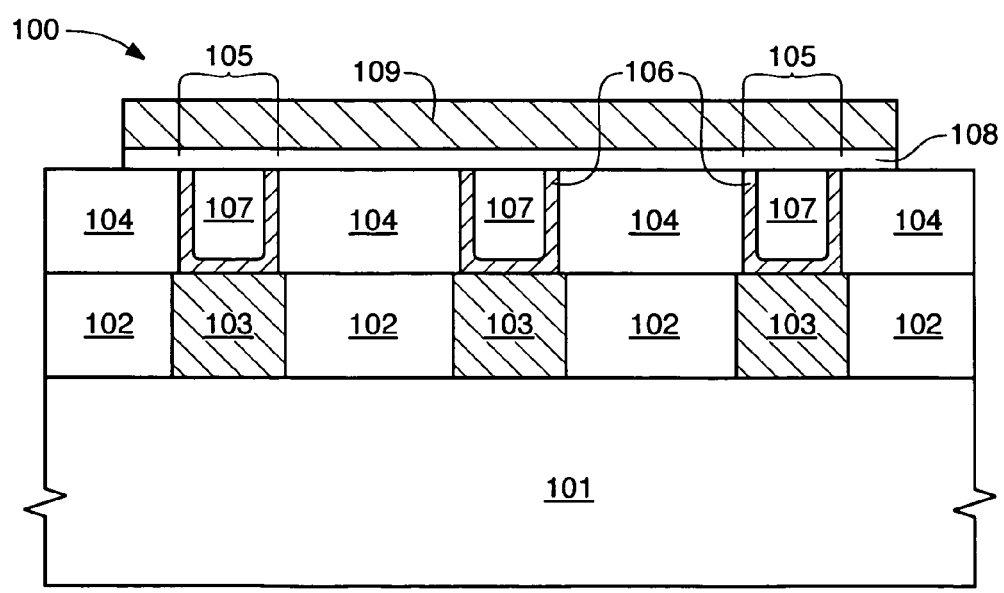

Top-down view, FIG. 7, and corresponding cross sectional view, FIG. 8 (taken through line 1'-1' of FIG. 7), depict the semiconductor assembly 100 after a deposition of a layer of dielectric material 108, followed by a deposition of a conductive material 109, such as a metal layer. The stack material of dielectric material 108 and conductive layer 109 are patterned such that each patterned stack comprising dielectric material 108 and conductive layer 109 overlie two rows of bottom electrodes 106 as both edges of the patterned stack run along the middle of the adjacent rectangular bottom electrodes 106.

Figure 9:
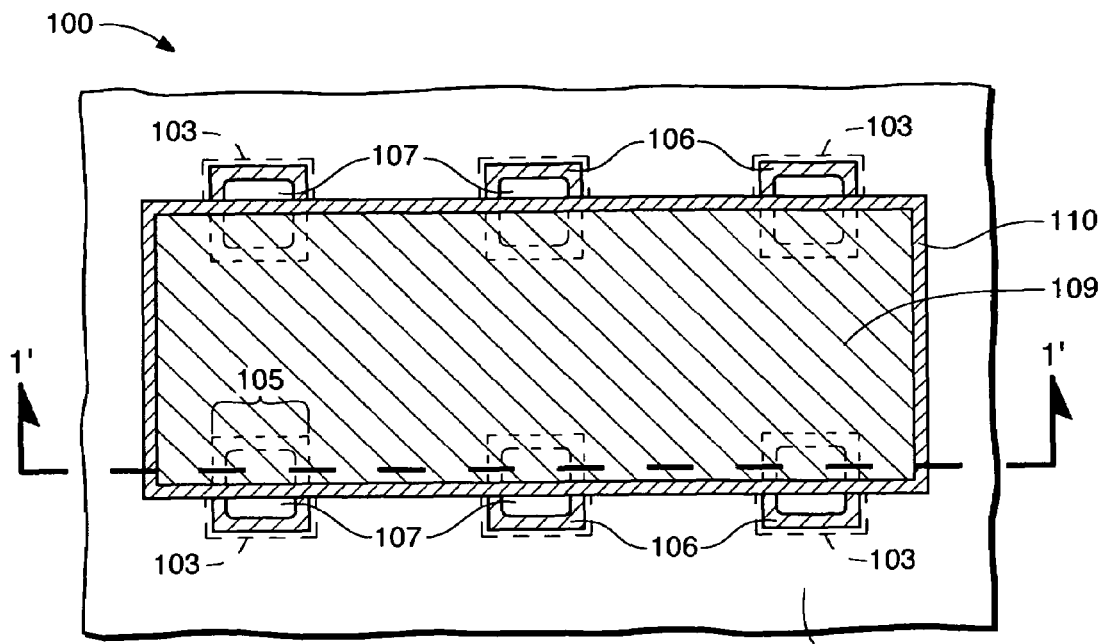
FIG. 9 and FIG. 10, a top-down view and a corresponding cross sectional view in reference to FIG. 7, and FIG. 8, respectively, show the substrate assembly after a deposition of a layer of phase change material, followed by patterning and etching the phase change material to form a phase change liner on the sidewalls of the patterned stack of the dielectric material and the metal-one layer.
Figure 10:
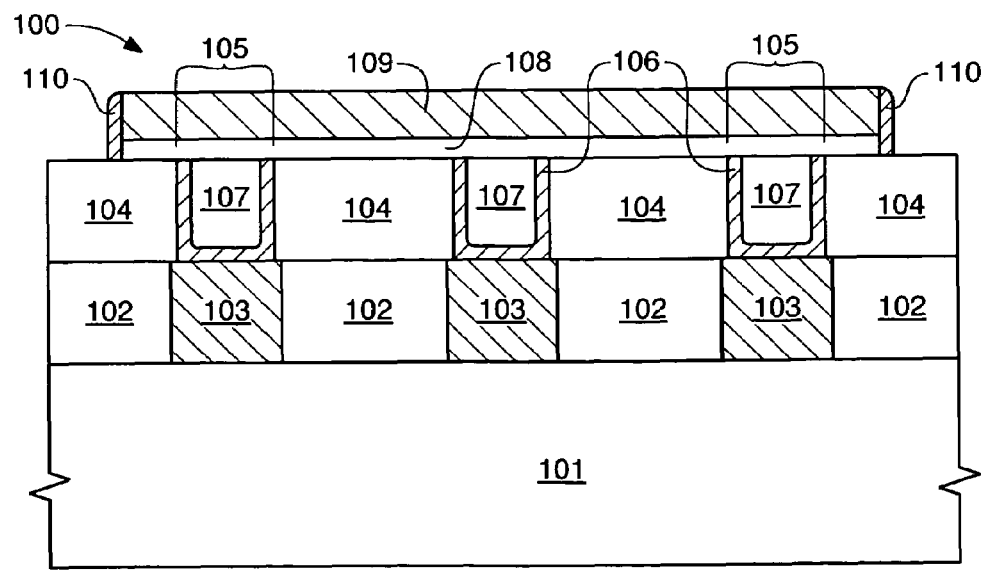

Top-down view, FIG. 9, and corresponding cross sectional view, FIG. 10 (taken through line 1'-1' of FIG. 9), depict the semiconductor assembly 100 after the formation of phase change material liner 110 on the sidewalls of the patterned stack of the dielectric material 108 and the conductive layer 109. To form the phase change material liner 110, a deposition of a conformal thin layer of phase change material is deposited to cover patterned conductive layer 109, as well as surrounding field areas of the substrate assembly 100. The phase change material is then subjected to a conventional spacer etch that results in phase change liner 110 that effectively makes physical contact between conductive layer 109 and the sidewall bottom electrodes made up by conductive liners 106. Phase change liner 110 can be seen as outlining the patterned conductive layer 109 in the overhead view of FIG. 9.

Figure 11:
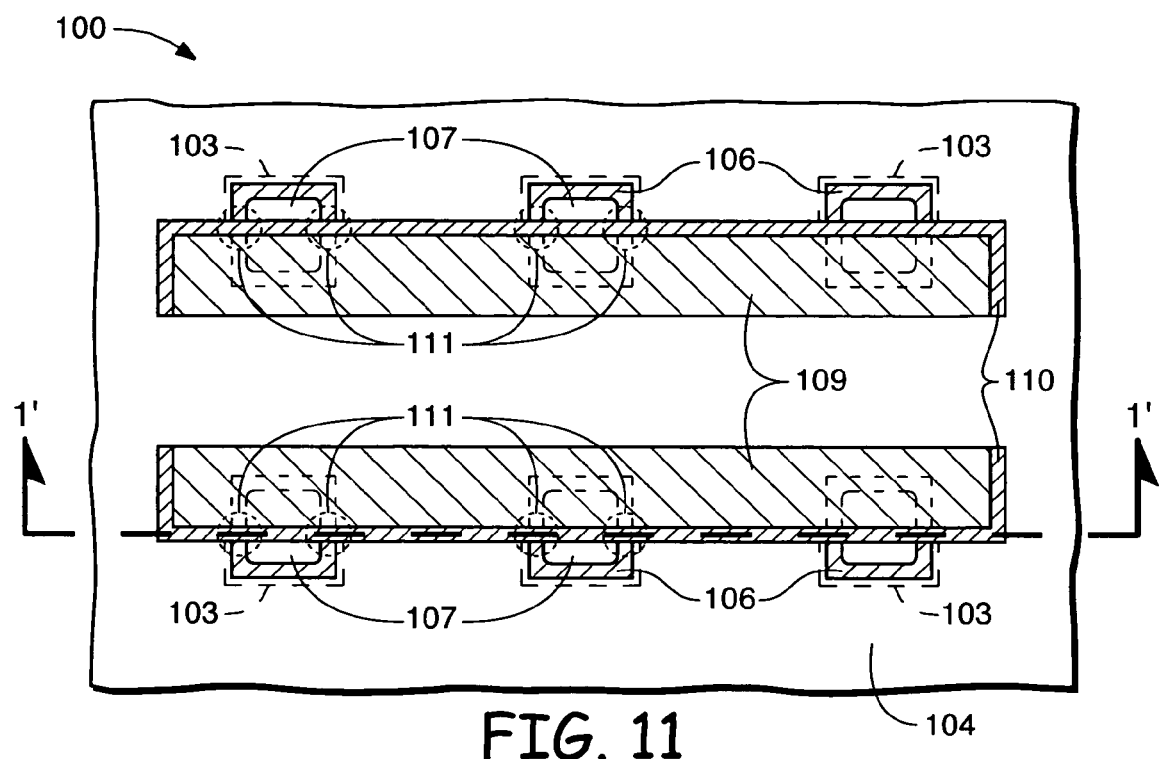
FIG. 11 and FIG. 12, a top-down view and a corresponding cross sectional view in reference to FIG. 9, and FIG. 10, respectively, show the substrate assembly after an optional step is performed where the metal-one is dry etched to isolate a first portion of the phase change cell from a second portion of the phase change cell.
Figure 12:
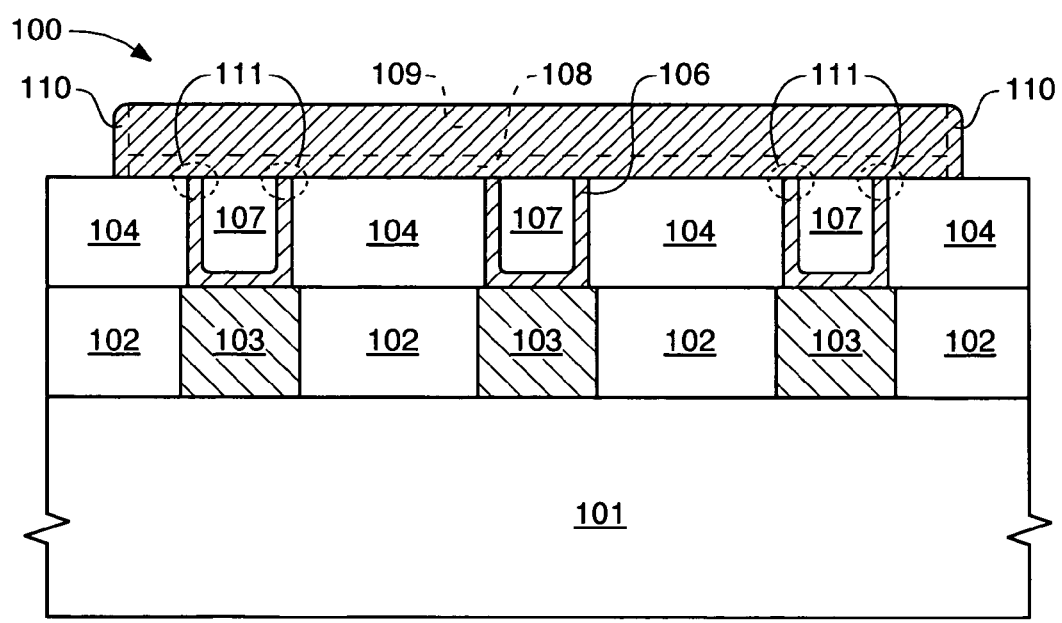
Figure 13:
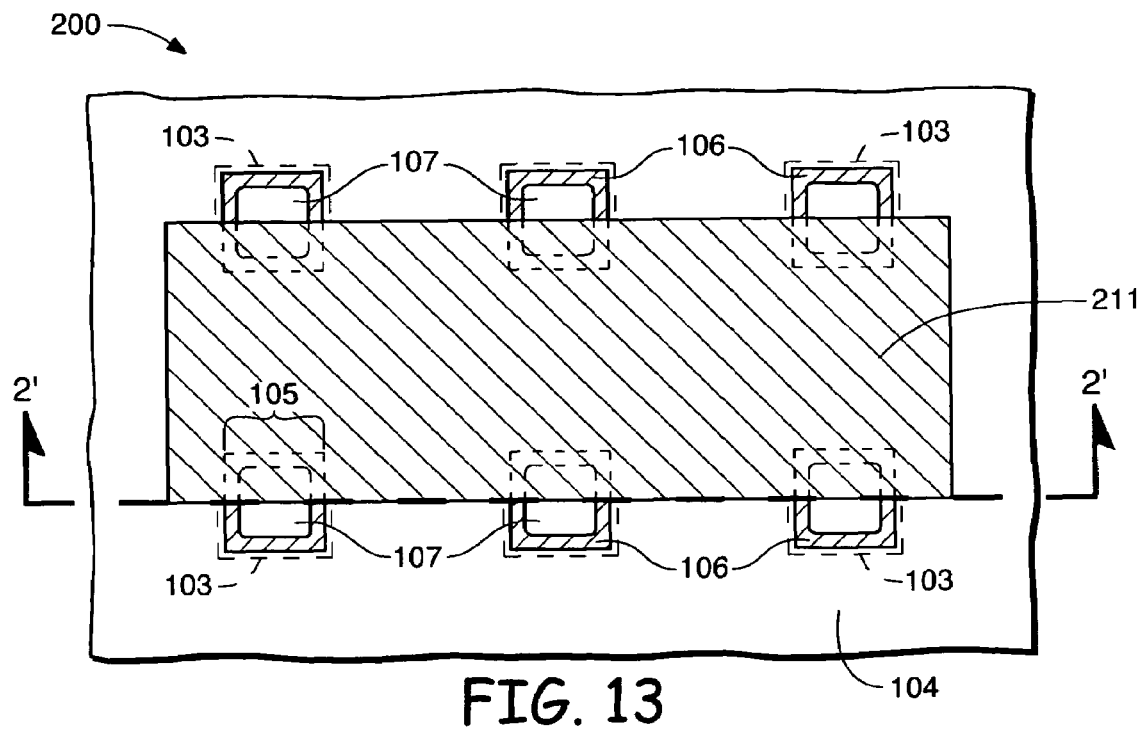
FIG. 13 and FIG. 14, a top-down view and a corresponding cross sectional view in reference to FIG. 5, and FIG. 6, respectively, show the substrate assembly after a deposition of a layer of dielectric material, a deposition of a conductive layer and a patterning of the dielectric layer and the conductive layer such that each patterned stack comprising the dielectric material and the conductive layer make contact with two rows of bottom electrodes with both edges of the stack in the middle of the adjacent rectangular bottom electrodes.

Top-down view, FIG. 11, and corresponding cross sectional view, FIG. 12 (taken through line 1'-1' of FIG. 11), depict the semiconductor assembly 100 after an optional step where the previous patterned conductive material 109 and phase change liner 110 are dry etched to isolate a first phase change cell portion from a second phase change cell portion, thus forming two rows of phase change cells comprises a two rows of separate and adjacent bottom electrodes (conductive liner 106) and a top electrodes (patterned conductive layer 109), which are connected together by the patterned phase change material (phase change liner 110). This pattern repeats to form a phase change memory array.

Ultra-small contacts 111 are determined by the intersection at the sidewall bottom electrode (conductive liners 106) and the phase change liner 110. The areas of ultra-small contacts 111 are determined by the thickness of the sidewall bottom electrode and the phase change liner 110. Since both materials used to form the conductive liners 106 and phase change liner 110 may be as thin as 100 Å or less, the effective contact area can be reduced down to 100 nm$^2$ or less, which is far smaller than other bottom electrode configurations currently used in industry. The minimum contact area of plug bottom electrodes currently fabricated with spacer formation is reported to be around 2000 nm$^2$.

The combination of the sidewall phase change liner 110 and the sidewall bottom electrode 106 forms a minimum effective contact area 111, which is defined by the intersection described above, and provides an advantageous feature of this exemplary implementation of the present invention. The effective contact area can be as small as 25 nm$^2$ if both liners are 5 nm in thickness. The present invention allows a small effective contact area which is impossible to achieve with the current photolithography and dry etch technologies.

Thus, the first exemplary implementation of the present invention provides a significant fabrication advantage gained by the reduced contact area which allows for future phase change memory devices to be significantly scaled down in die size. The phase change memory device is then completed using conventional fabrication techniques such as those used to form digit lines to make contact to a series of phase change cells determined by the memory array layout of the desired phase change cell memory architecture.

A second exemplary implementation of the present invention is depicted in FIGS. 13-20 in conjunction with the formation of the bottom electrodes 106 as depicted in FIGS. 1-6. Referring now to top-down view, FIG. 13, and corresponding cross sectional view, FIG. 14 (taken through line 2'-2' of FIG. 13), the semiconductor assembly 200 after a deposition of a layer of dielectric material 210, followed by a deposition of a conductive material 211 to serve as the top electrode of each phase change memory cell. The stack material of dielectric material 210 and conductive material 211 are patterned such that each patterned stack of dielectric material 210 and conductive material 211 make contact with two rows of bottom electrodes 106 at both edges of the stack in the middle of the adjacent rectangular bottom electrodes by making physical connection to each conductive liner (or bottom electrode) 106.

Figure 14:
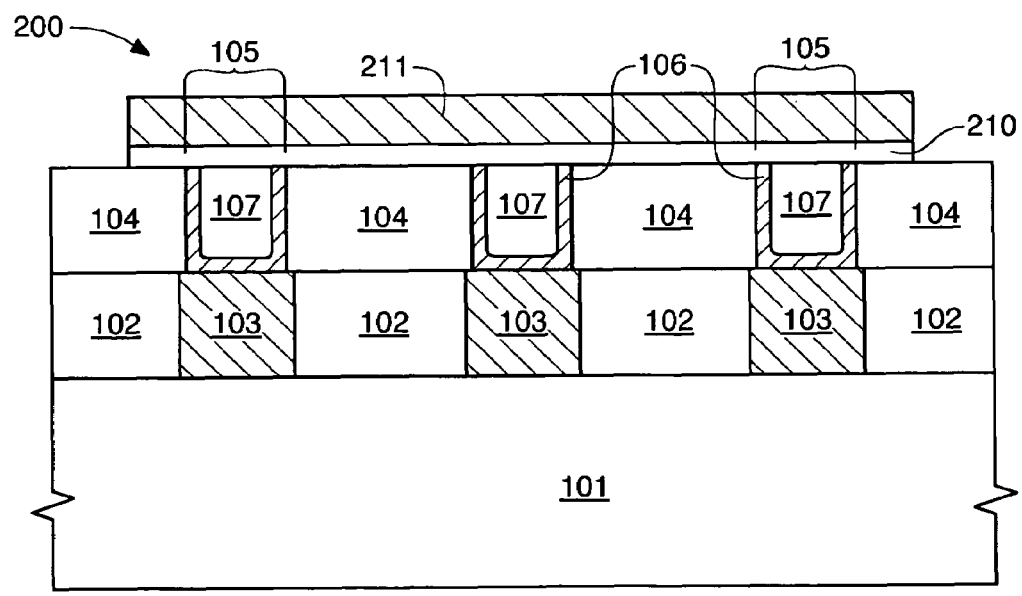
Figure 15:
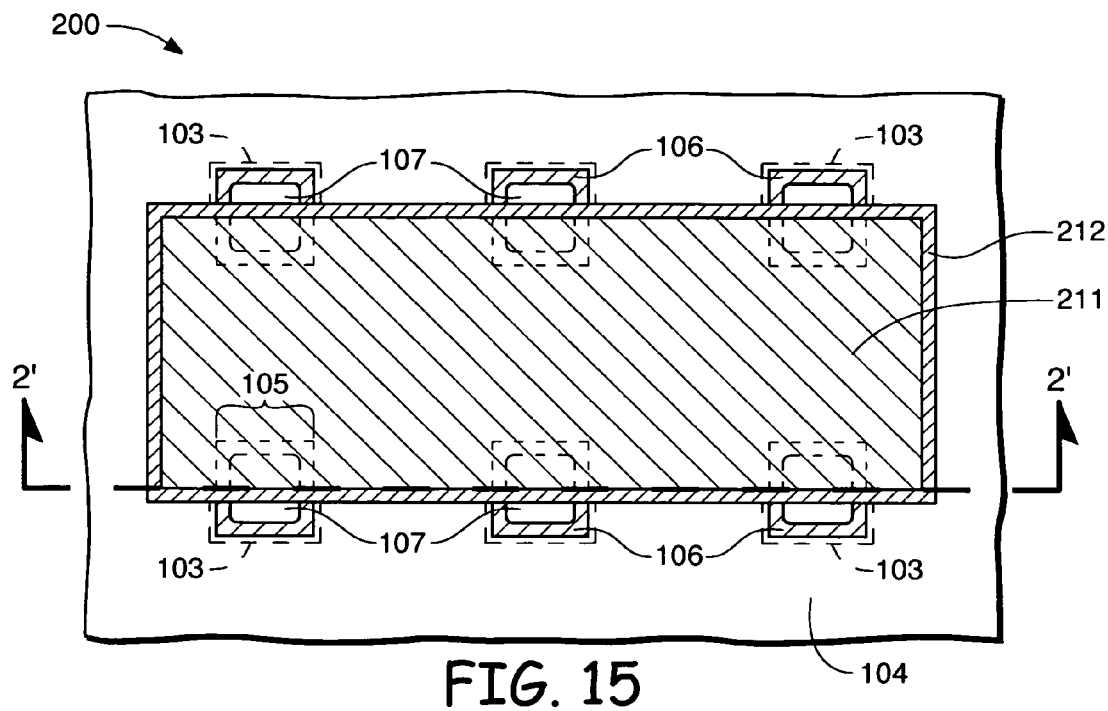
FIG. 15 and FIG. 16, a top-down view and a corresponding cross sectional view in reference to FIG. 13, and FIG. 14, respectively, show the substrate assembly after a deposition of a layer of phase change material, followed by patterning and etching the phase change material to form a phase change liner on the sidewall of the patterned stack of the dielectric material and the conductive layer such that the phase change sidewall are in electrical contact to both the sidewall bottom electrode and sidewall of the top electrode.
Figure 16:
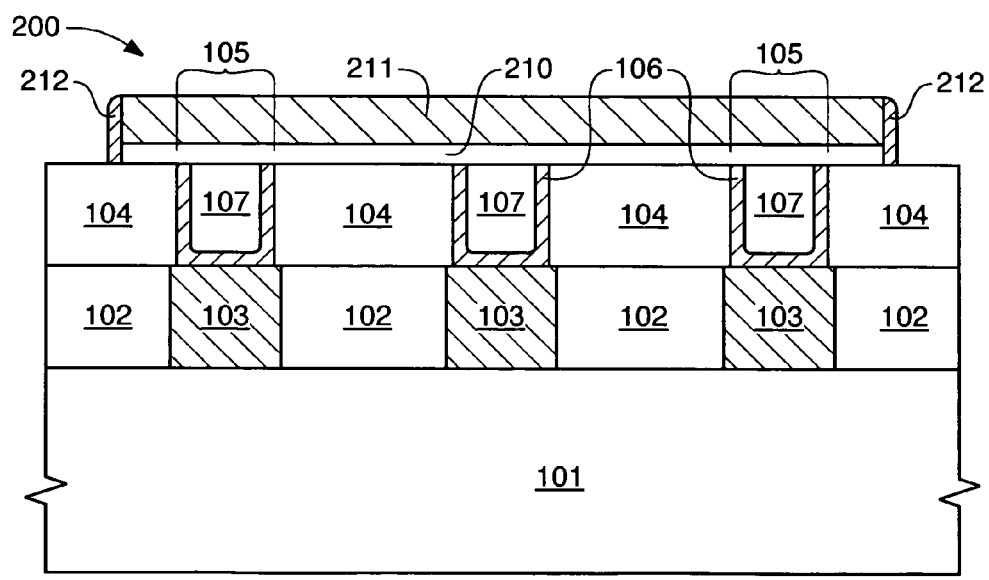

Top-down view, FIG. 15, and corresponding cross sectional view, FIG. 16 (taken through line 2'-2' of FIG. 15), depict the semiconductor assembly 200 after the formation of phase change material liner 212 on the sidewalls of the patterned stack of the dielectric material 210 and conductive material 211 seen in FIG. 14. To form the phase change material liner 212, a deposition of a conformal thin layer of phase change material is deposited to cover patterned conductive material 211, as well as surrounding field areas of the substrate assembly 200. The phase change material is then subjected to a conventional spacer etch that results in phase change liner 212 that effectively makes physical contact between conductive material 211 and the bottom electrodes 106. Phase change liner 212 can be seen as outlining the patterned conductive material 211 in the overhead view of FIG. 15.

Figure 17:
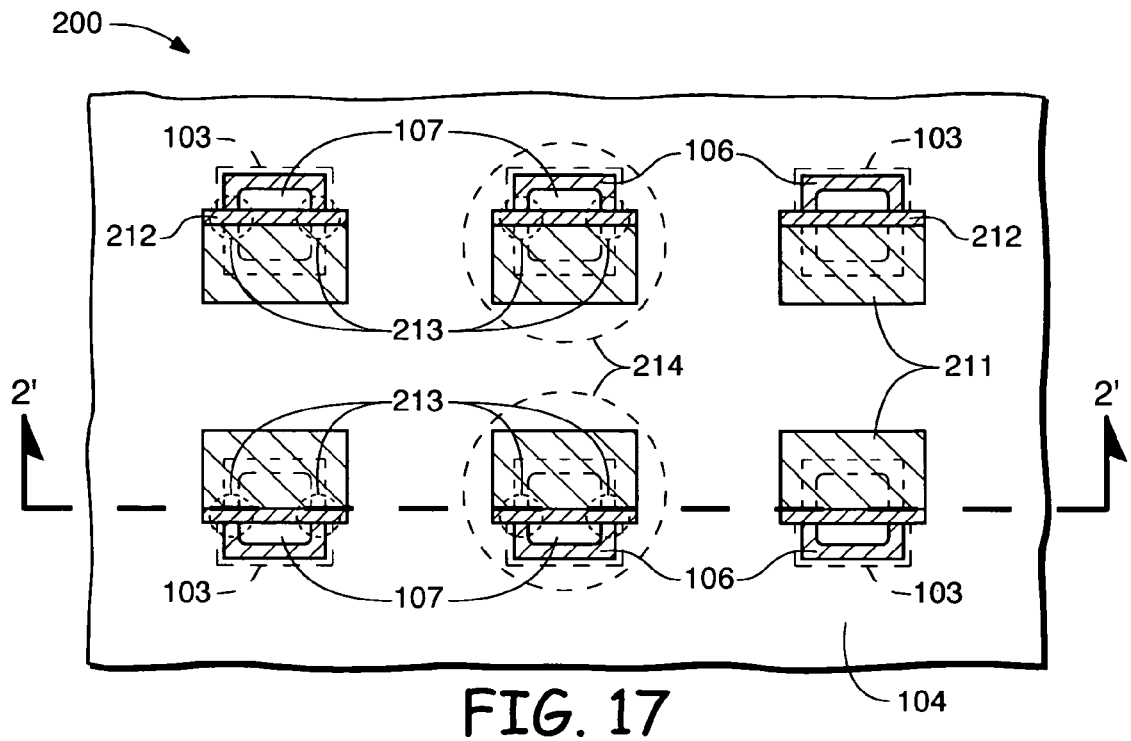
FIG. 17 and FIG. 18, a top-down view and a corresponding cross sectional view in reference to FIG. 15, and FIG. 16, respectively, show the substrate assembly after the phase change cell and the top electrode are dry etched to isolate a first-phase change cell from a second phase change cell which also forms ultra-small contacts between the phase change sidewall material and the sidewall bottom electrode.
Figure 18:
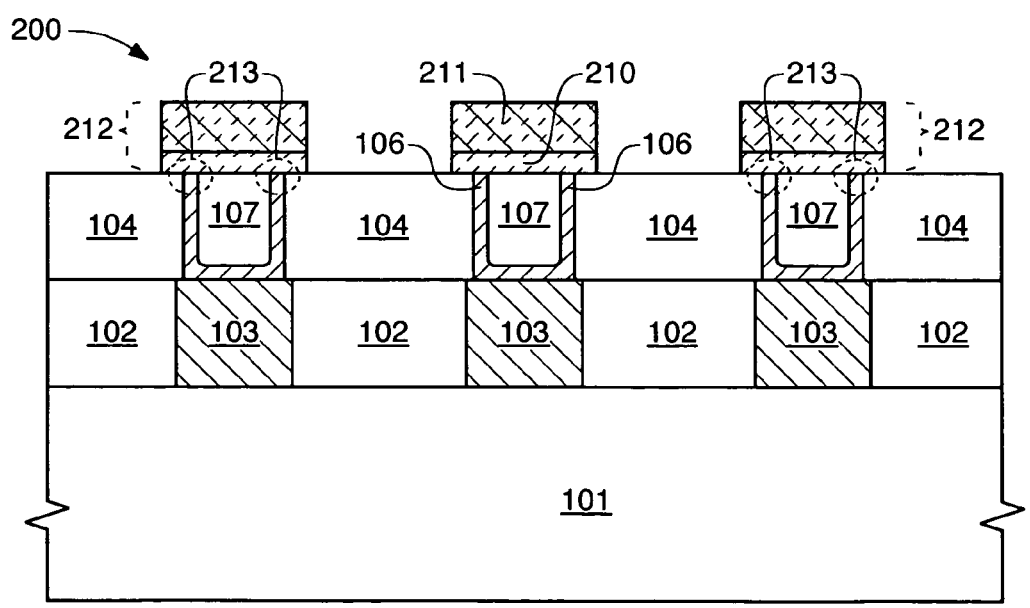

Top-down view, FIG. 17, and corresponding cross sectional view, FIG. 18 (taken through line 2'-2' of FIG. 17), depict the semiconductor assembly 200 after the previous patterned conductive material 211 and phase change liner 212 are patterned and dry etched to isolate a first phase change cell portion from a second phase change cell portion, such that an individual phase change cell is formed at each conductive liner, thus forming a complete phase change cell 214 comprising a bottom electrode 106 and a top electrode 211 (from patterned conductive material 211), which are connected together by the patterned phase change material (phase change liner 212).

As previously formed during the phase change liner formation, ultra-small contacts 213 are determined by the intersection of the sidewall bottom electrode 106 and the phase change liner 212. Since both materials used to form the bottom electrode and phase change liner may be as thin as 100 A or less, the effective contact area can be reduced down to 100 $nm^2$ or less, which is far smaller than other bottom electrode configurations currently used in industry. Currently, the minimum contact area of plug bottom electrodes fabricated with spacer formation techniques is reported to be around 2000 $nm^2$.

Figure 19:
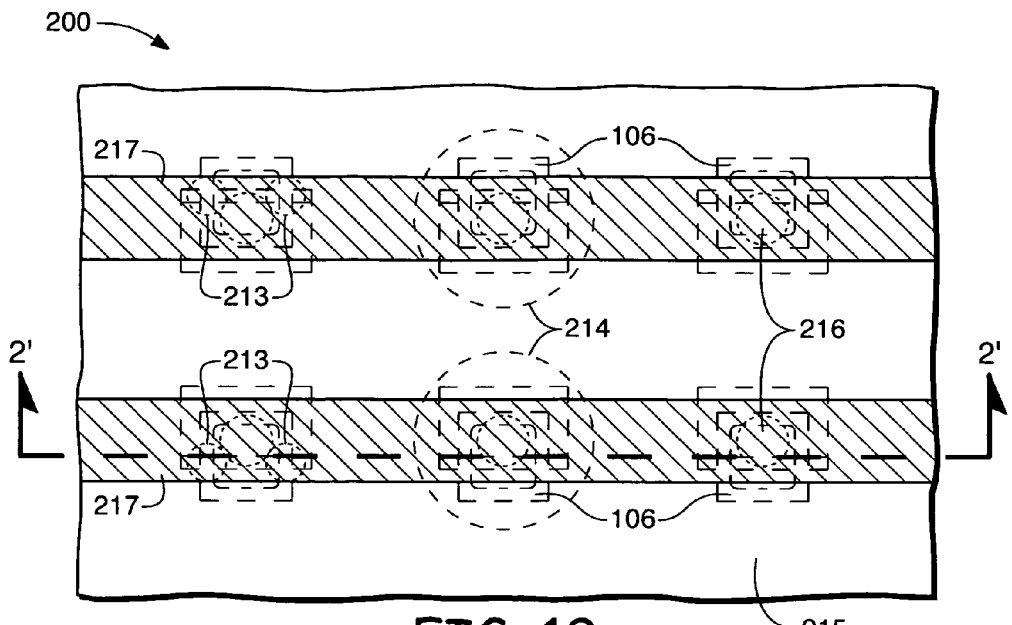
FIG. 19 and FIG. 20, a top-down view and a corresponding cross sectional view in reference to FIG. 17, and FIG. 18, respectively, show the substrate assembly after digit lines are patterned and etched to contact the top electrode of each phase change memory element.
Figure 20:
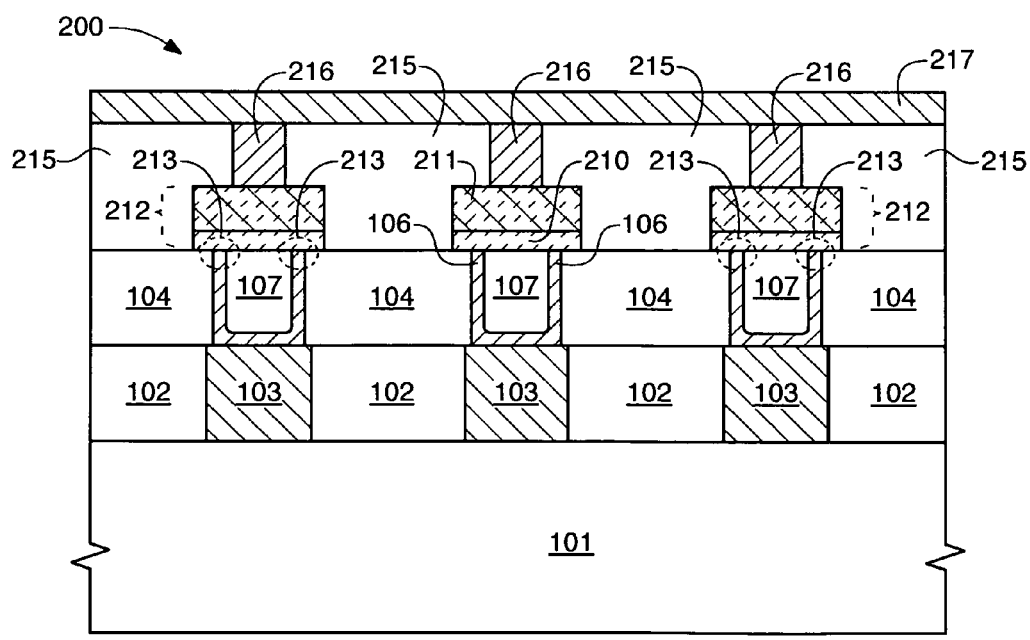

Top-down view, FIG. 19, and corresponding cross sectional view, FIG. 20 (taken through line 2'-2' of FIG. 19), depict the semiconductor assembly 200 after the formation of dielectric 215 covering the semiconductor assembly 200 and, in particular, each phase change cell 214. Individual contacts 216 are formed into dielectric 215 to make contact with each individual phase change cell. Then conductive digit lines 217 are formed to make contact to a series of phase change cell 214 determined by the memory array layout of the desired phase change cell memory architecture. The phase change memory device is then completed using conventional fabrication techniques.

Thus, the second exemplary implementation of the present invention provides a significant fabrication advantage gained by the reduced contact area which allows for future phase change memory devices to be significantly scaled down in die size.

Figure 21:
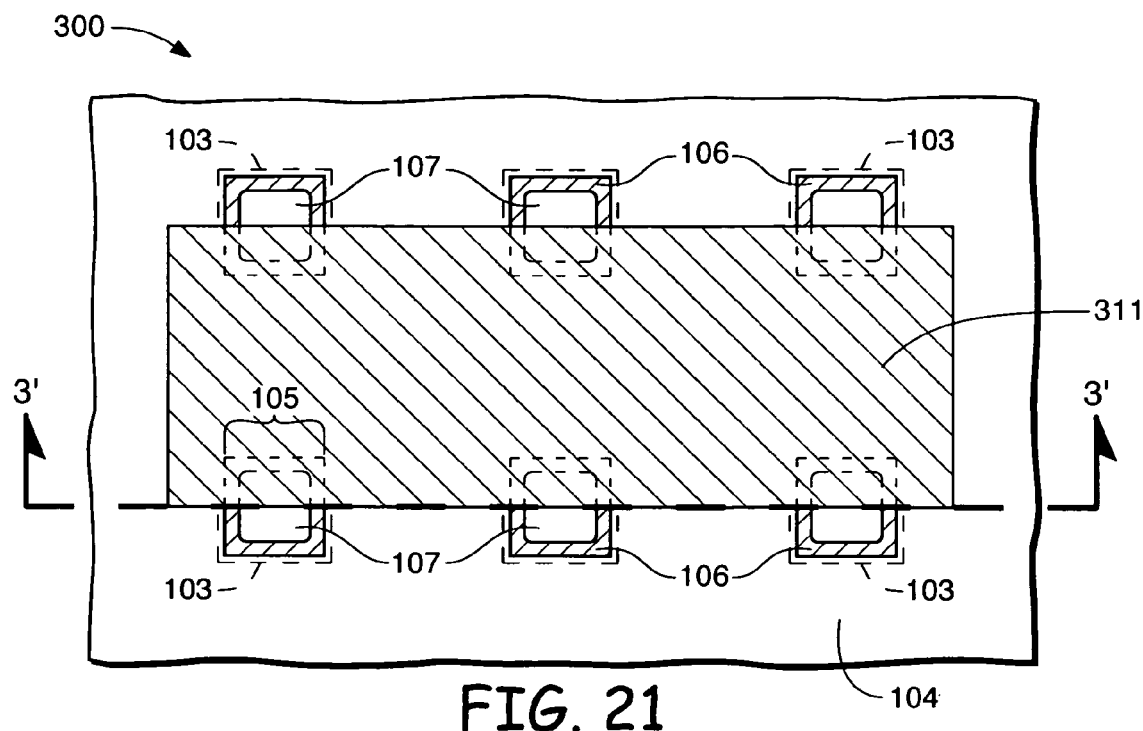
FIG. 21 and FIG. 22, a top-down view and a corresponding cross sectional view in reference to FIG. 5 and FIG. 6, respectively, show the substrate assembly after a deposition of a layer of dielectric material, a deposition of a conductive layer and a patterning of the dielectric layer and the conductive layer such that each patterned stack comprising the dielectric material and the conductive layer make contact with two rows of bottom electrodes of the stack in the middle of the adjacent rectangular bottom electrodes.
Figure 22:
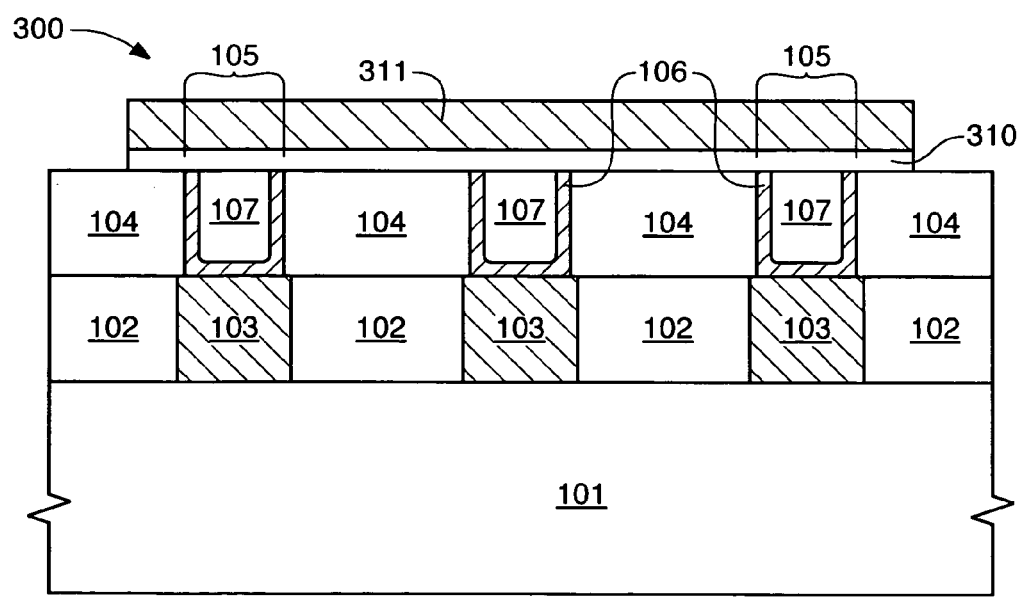

FIG. 21 and FIG. 22, a top-down view and a corresponding cross sectional view (taken through line 3'-3' of FIG. 21) in reference to FIG. 5 and FIG. 6, respectively, show the substrate assembly 300 after a deposition of a layer of dielectric material 310, a deposition of a conductive layer 311 and a patterning of the dielectric layer and the conductive layer such that each patterned stack, comprising the dielectric material 310 and the conductive layer 311, make contact with two rows of bottom electrodes 106 with both edges of the patterned stack aligning to the middle of the two rows of adjacent rectangular bottom electrodes 106. The patterned conductive layer will serve as a top electrode 311 for each phase change cell.

Figure 23:
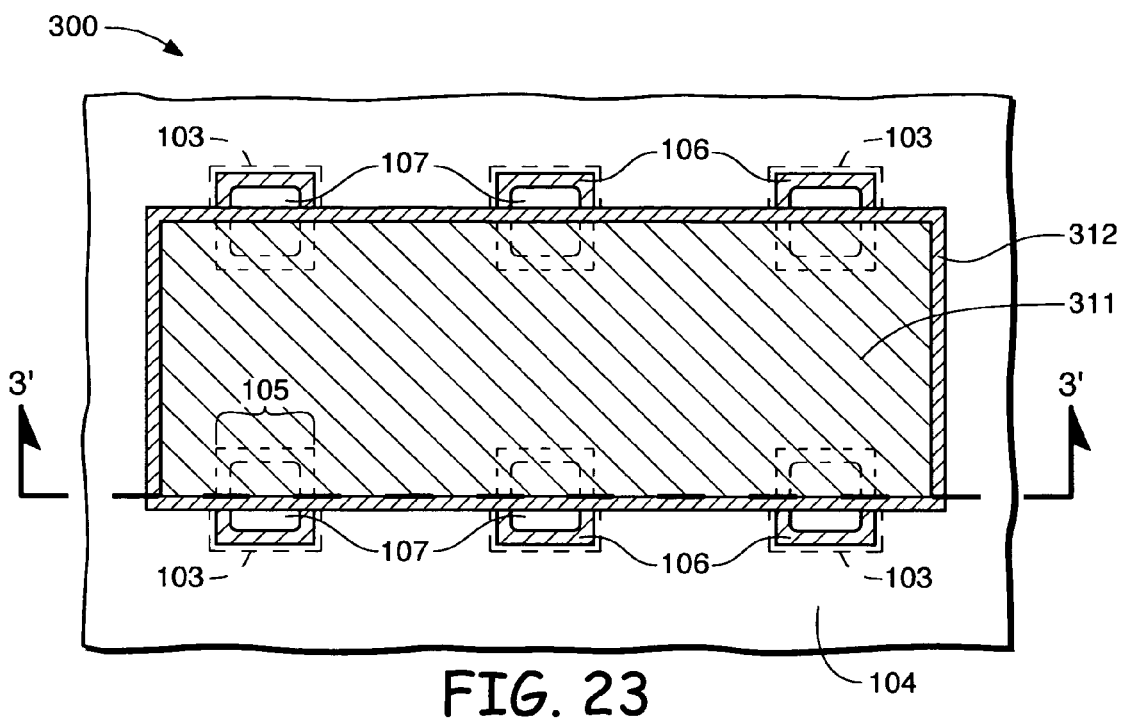
FIG. 23 and FIG. 24, a top-down view and a corresponding cross sectional view in reference to FIG. 21 and FIG. 22, respectively, show the substrate assembly after a deposition of a layer of phase change material, followed by patterning and etching the phase change material to form a phase change liner on the sidewall of the patterned stack of the dielectric material and the conductive layer such that the phase change liner is in electrical contact to the sidewall bottom electrode and the sidewall of the top electrode.
Figure 24:
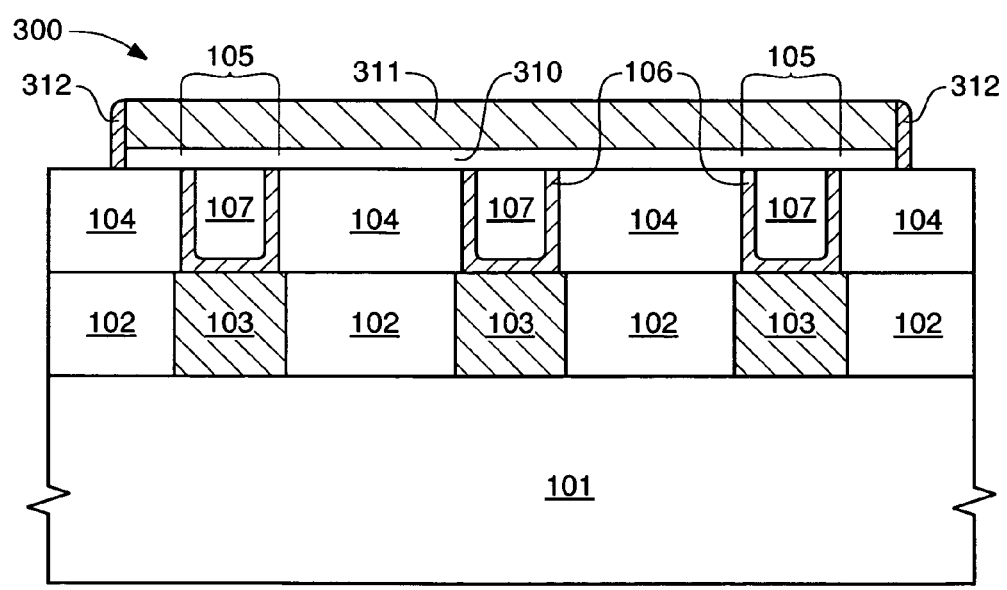

FIG. 23 and FIG. 24, a top-down view and a corresponding cross sectional view (taken through line 3'-3' of FIG. 23) in reference to FIG. 21 and FIG. 22, respectively, show the substrate assembly 300 after a deposition of a layer of a phase change material followed by patterning and etching the phase change material to form a phase change liner 312 on the sidewall of the patterned stack of the dielectric material 310 and the conductive layer 311 such that the phase change sidewalls are in physical contact to the sidewalls of bottom electrode 106 and the top electrode 311. To form the phase change material liner 312, a deposition of a conformal thin layer of phase change material is deposited to cover patterned conductive material 311, as well as surrounding field areas of the substrate assembly 300.

Figure 25:
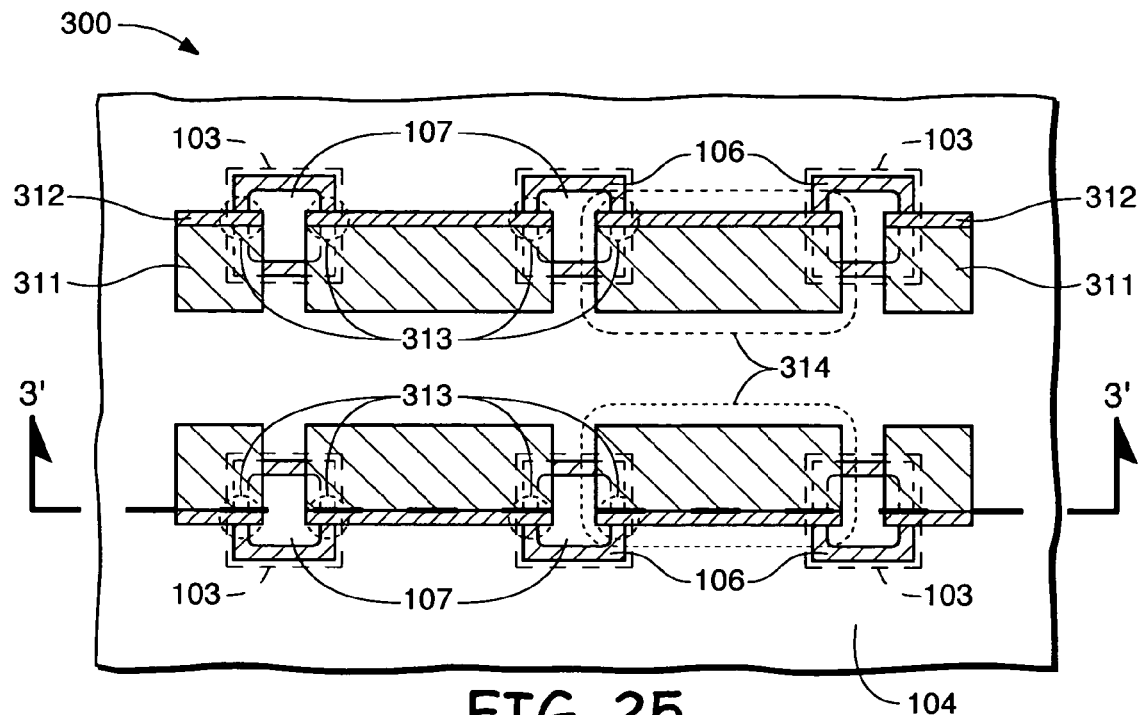
FIG. 25 and FIG. 26, a top-down view and a corresponding cross sectional view in reference to FIG. 23 and FIG. 24, respectively, show the substrate assembly after the phase change cell and the top electrode are dry etched such that each phase change cell has two ultra-small contacts between the phase change sidewall material and two adjacent sidewall bottom electrodes, to form two memory bits within each phase change cell, sharing the same top electrode.
Figure 26:
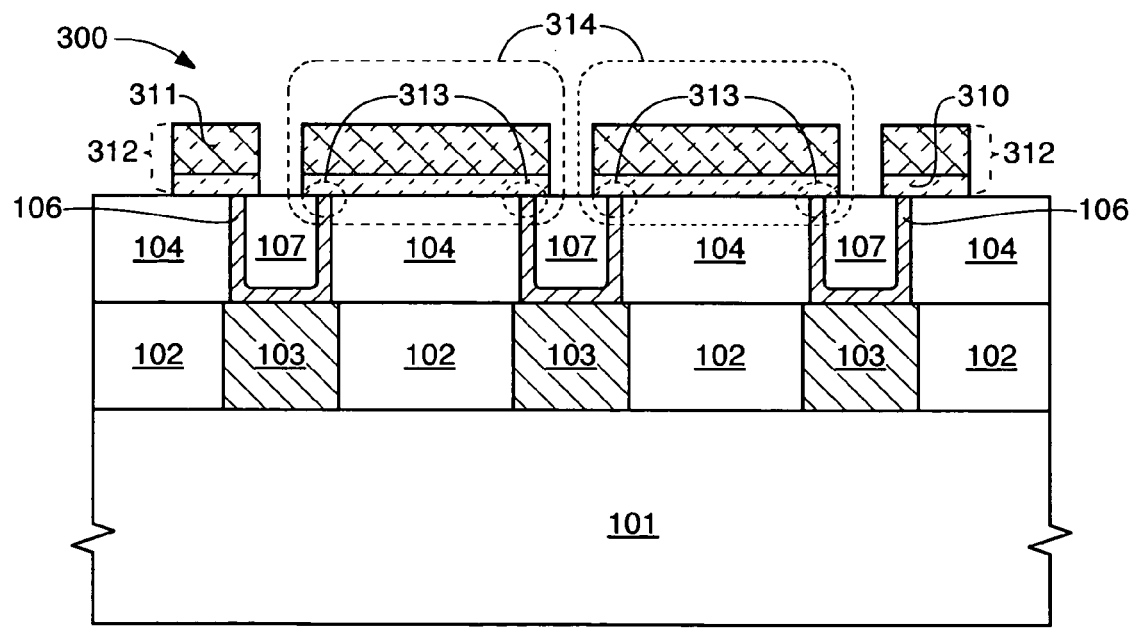

FIG. 25 and FIG. 26, a top-down view and a corresponding cross sectional view (taken through line 3'-3' of FIG. 25) in reference to FIG. 23 and FIG. 24, respectively, show the substrate assembly 300 after the phase change liner 312 and the top electrode 311 are dry etched such that each phase change cell 314 has two ultra-small contacts 313 between the phase change liner 312 and two adjacent sidewall bottom electrodes 106 to form two memory bits in one phase change cell sharing the same top electrode. Each memory bit can be selected by selecting the corresponding top electrode and bottom electrode.

Figure 27:
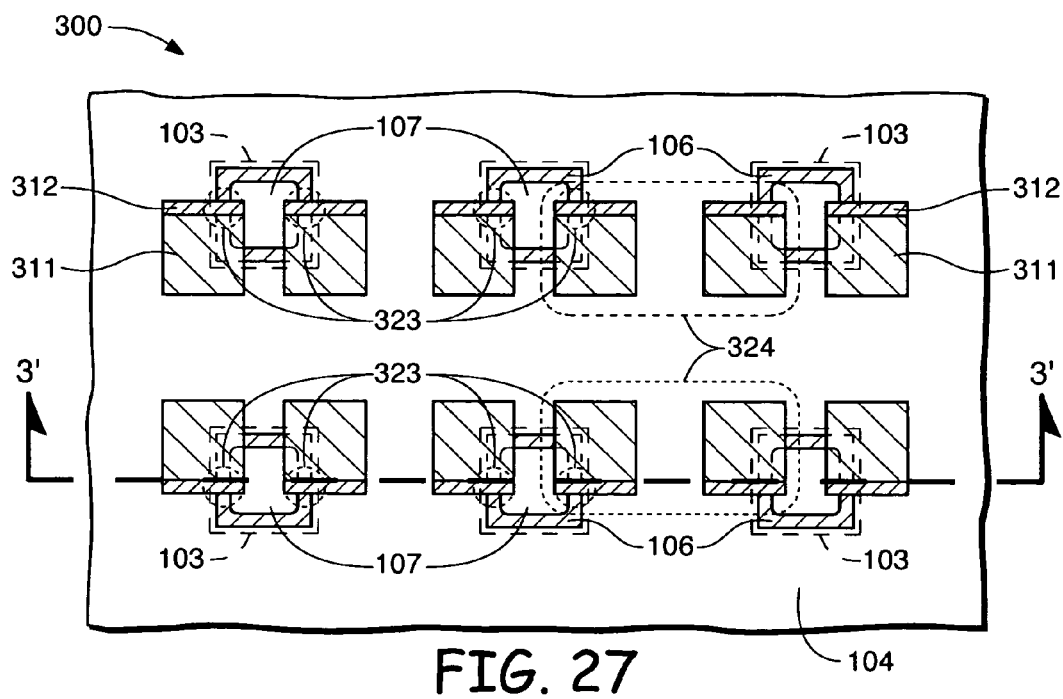
FIG. 27 and FIG. 28, a top-down view and a corresponding cross sectional view in reference to FIG. 25 and FIG. 26, respectively, show the substrate assembly after the phase change cell and the top electrode are dry etched such that two phase change cells have separate top electrodes connected by ultra-small contacts between the sidewall phase change material and the sidewall bottom electrode and each phase change cell only contains one ultra-small contact and consequently one memory bit.
Figure 28:
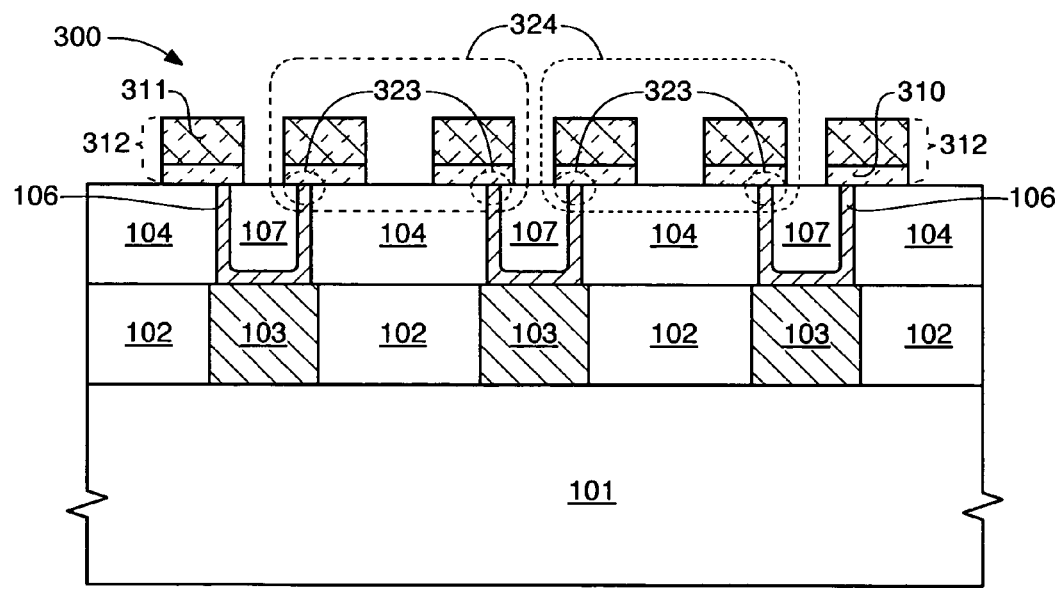

FIG. 27 and FIG. 28, a top-down view and a corresponding cross sectional view in reference to FIG. 25 and FIG. 26, respectively, show an optional etching strategy that creates two cells that have separate top electrodes. Substrate assembly 300 is depicted after the phase change liner 312 and the top electrode 311 are dry etched such that two phase change cells 324 have separate top electrodes connected by ultra-small contacts 323 between the phase change liner 312 and the sidewall bottom electrode 106 and each phase change memory cell contains only one ultra-small contact and consequently one memory bit.

As previously formed during the phase change liner formation, ultra-small contacts 313 are determined by the intersection of the sidewall bottom electrode 106 and the sidewall of the phase change liner 312. Since both materials used to form the bottom electrode and phase change liner may be as thin as 100 A or less, the effective contact area can be reduced down to 100 $nm^2$ or less, which is far smaller than other bottom electrode configurations currently used in industry. The current minimum contact area of plug bottom electrodes fabricated with spacer formation techniques is reported to be around 2000 $nm^2$.

Thus, the third exemplary implementation of the present invention provides a significant fabrication advantage gained by the reduced contact area which allows for future phase change memory devices to be significantly scaled down in die size.

Figure 29:
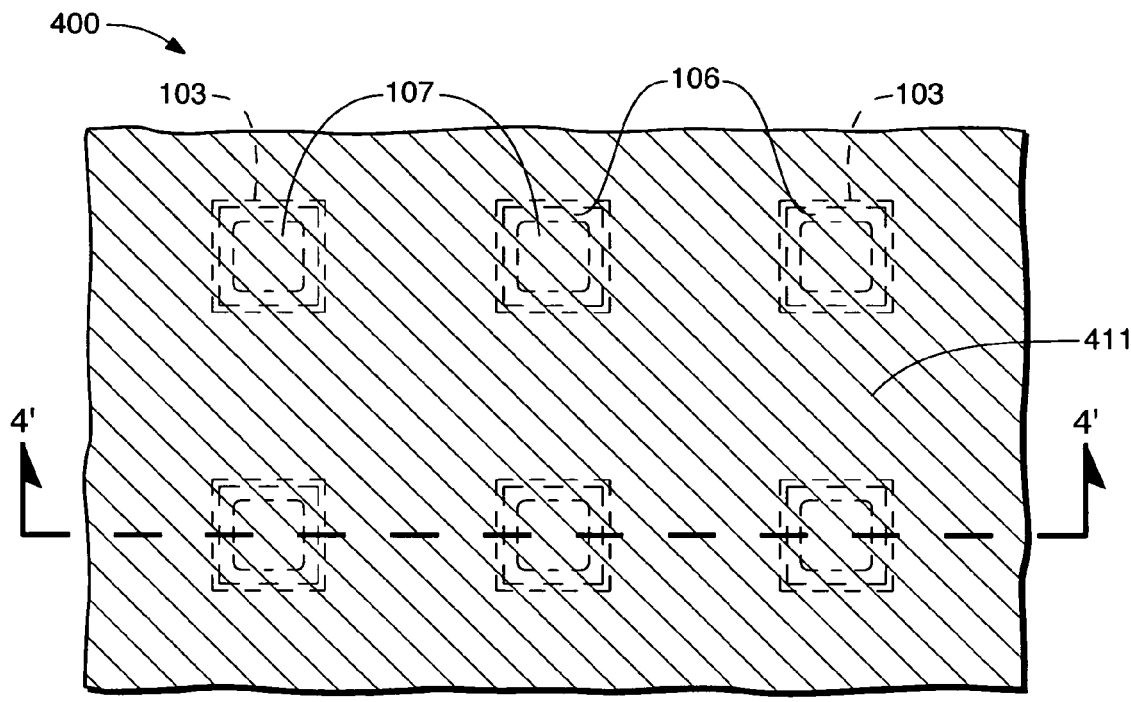
FIG. 29 and FIG. 30, a top-down view and a corresponding cross sectional view in reference to FIG. 5 and FIG. 6, respectively, show the substrate assembly after a deposition of a layer of dielectric material, a deposition of a conductive layer.
Figure 30:
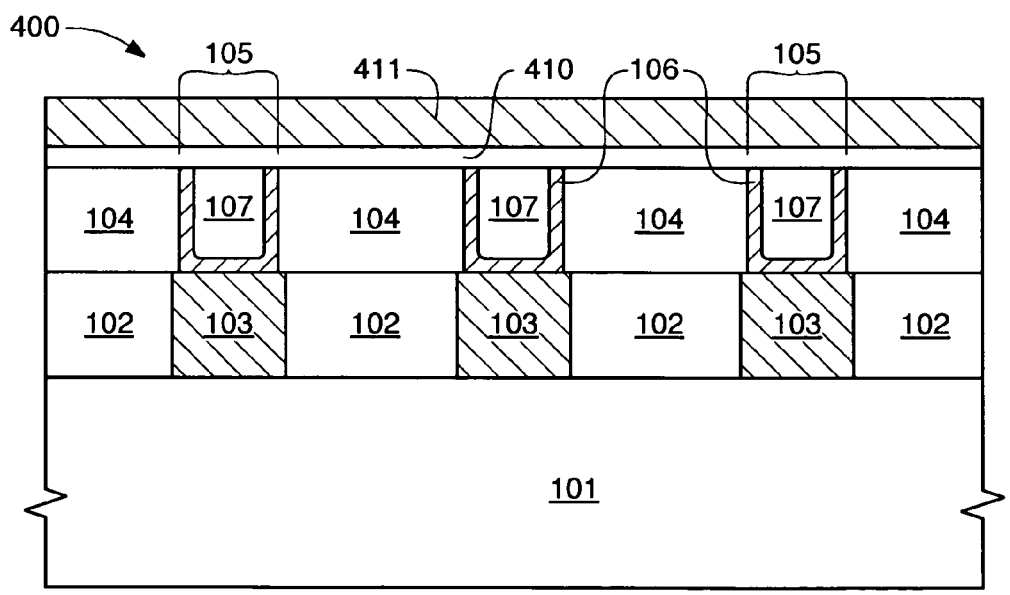

FIG. 29 and FIG. 30, a top-down view and a corresponding cross sectional view (taken through line 4'-4' of FIG. 29) in reference to FIG. 5 and FIG. 6, respectively, show the substrate assembly 400 after a deposition of a layer of dielectric material 410, a deposition of a conductive layer 411 over existing bottom electrodes 106 previously formed as depicted in FIGS. 1-6.

Figure 31:
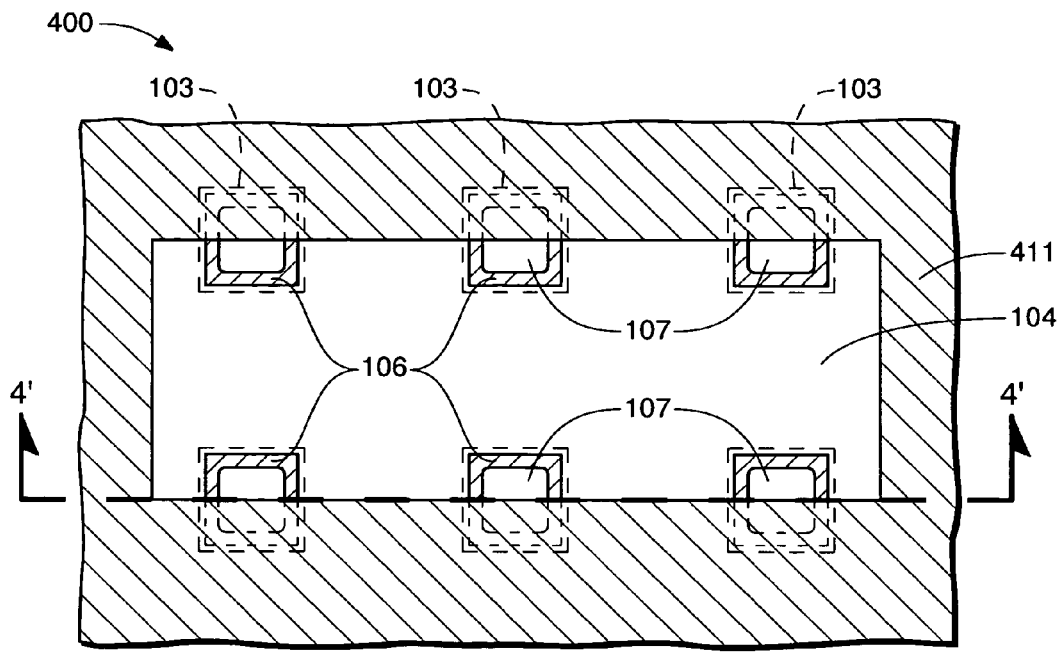
FIG. 31 and FIG. 32, a top-down view and a corresponding cross sectional view in reference to FIG. 29 and FIG. 30, respectively, show the substrate assembly after patterning of the dielectric layer and the conductive layer to leave an opening in contact with two rows of the bottom electrodes and both edges of the stack in middle of the adjacent rectangular bottom electrodes.
Figure 32:
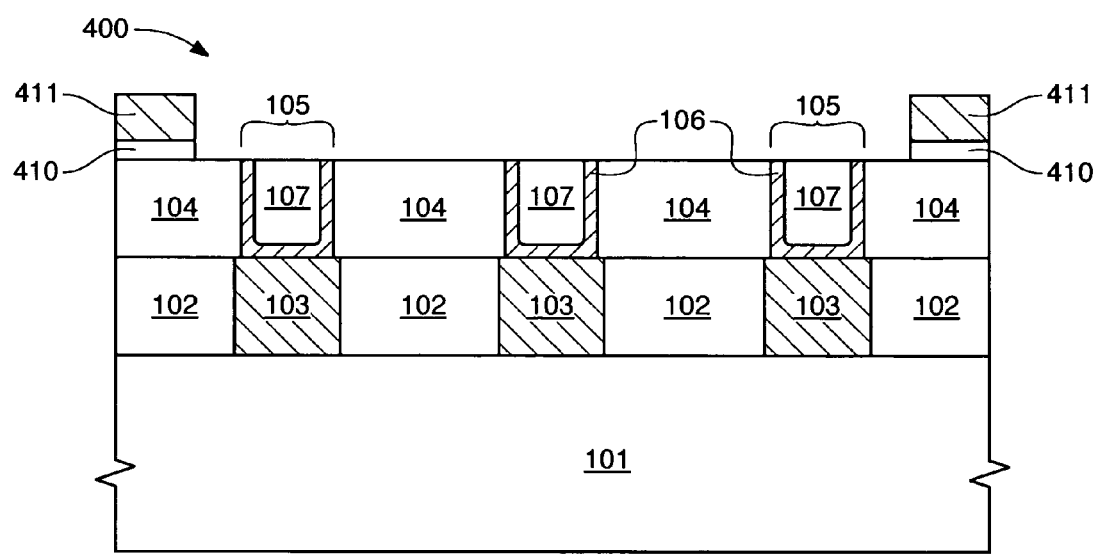

FIG. 31 and FIG. 32, a top-down view and a corresponding cross sectional view (taken through line 4'-4' of FIG. 31) in reference to FIG. 29 and FIG. 30, respectively, show the substrate assembly 400 after a patterning and etching of the dielectric layer 410 and the conductive layer 411 to form an opening over the middle sections of two adjacent rows of bottom electrodes. The top and bottom rectangular portions of dielectric material 410 make physical contact with the two adjacent rows of bottom electrodes respectively, as shown in the illustration.

Figure 33:
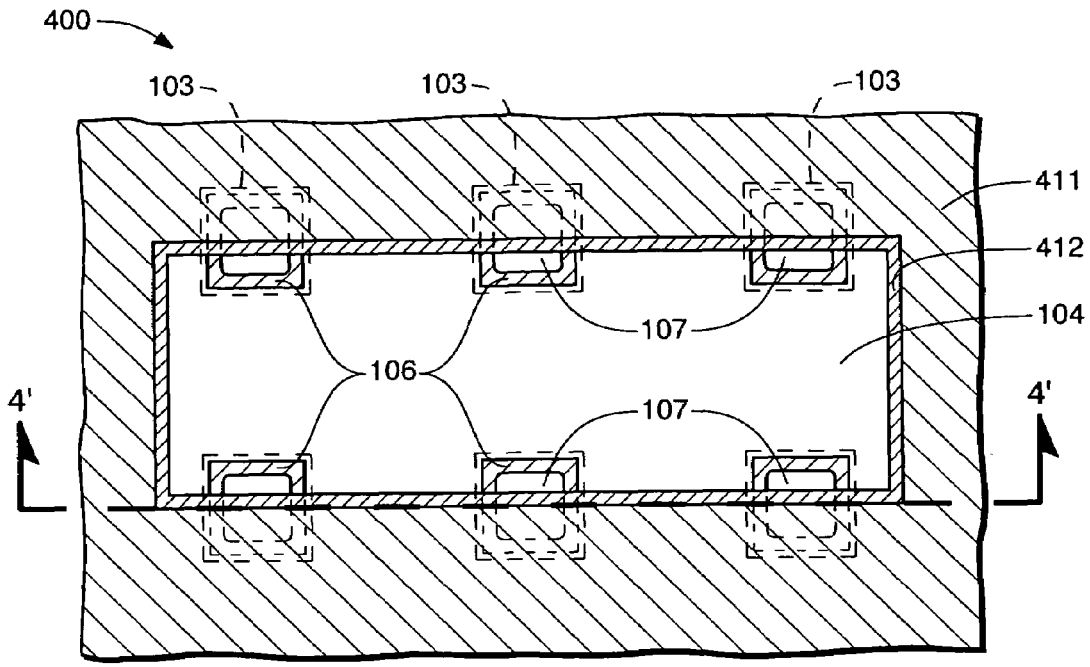
FIG. 33 and FIG. 34, a top-down view and a corresponding cross sectional view in reference to FIG. 31 and FIG. 32, respectively, show the substrate assembly after the deposition of a layer of phase change material, followed by patterning and etching the phase change material to form a phase change liner on the inner sidewall of the patterned stack of the dielectric material and the conductive layer such that the phase change liner is in electrical contact to both the sidewall bottom electrode and the sidewall of the top electrode.
Figure 34:
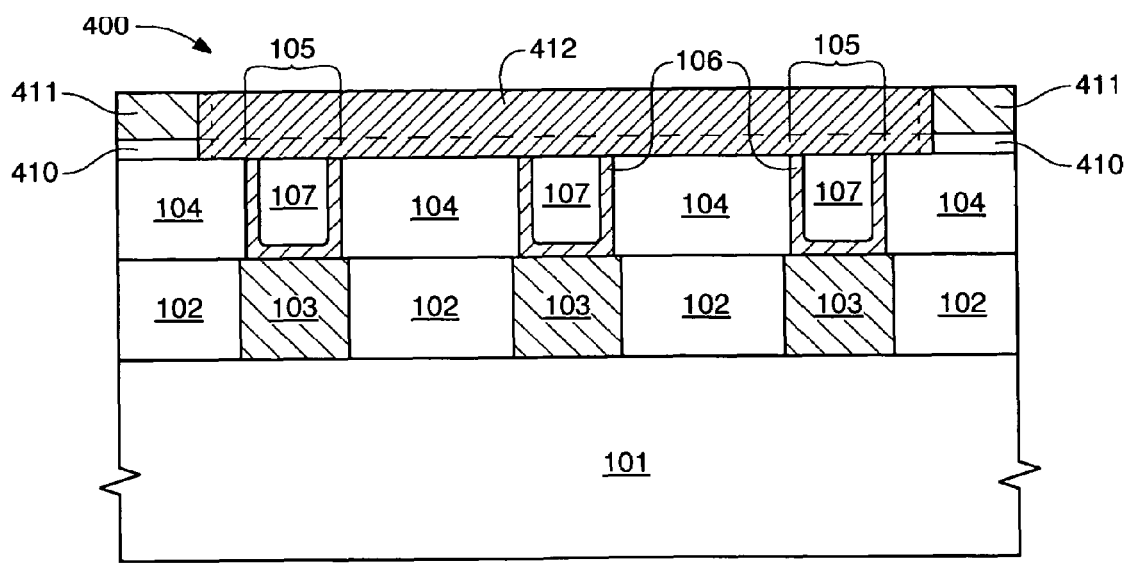

FIG. 33 and FIG. 34, a top-down view and a corresponding cross sectional view (taken through line 4'-4' of FIG. 33) in reference to FIG. 31 and FIG. 32, respectively, show the substrate assembly 400 after the deposition of a layer of phase change material, followed by patterning and etching the phase change material to form a phase change liner 412 on the inner sidewall of the patterned stack of the dielectric material 410 and on the inner sidewall of each segment of the conductive layer 411 such that the phase change sidewall (or liner) 412 is in physical contact to both the sidewall bottom electrode and the top of the top electrode. To form the phase change material liner 412, a deposition of a conformal thin layer of phase change material is deposited to cover patterned conductive material 411, as well as surrounding field areas of the substrate assembly 400.

Figure 35:
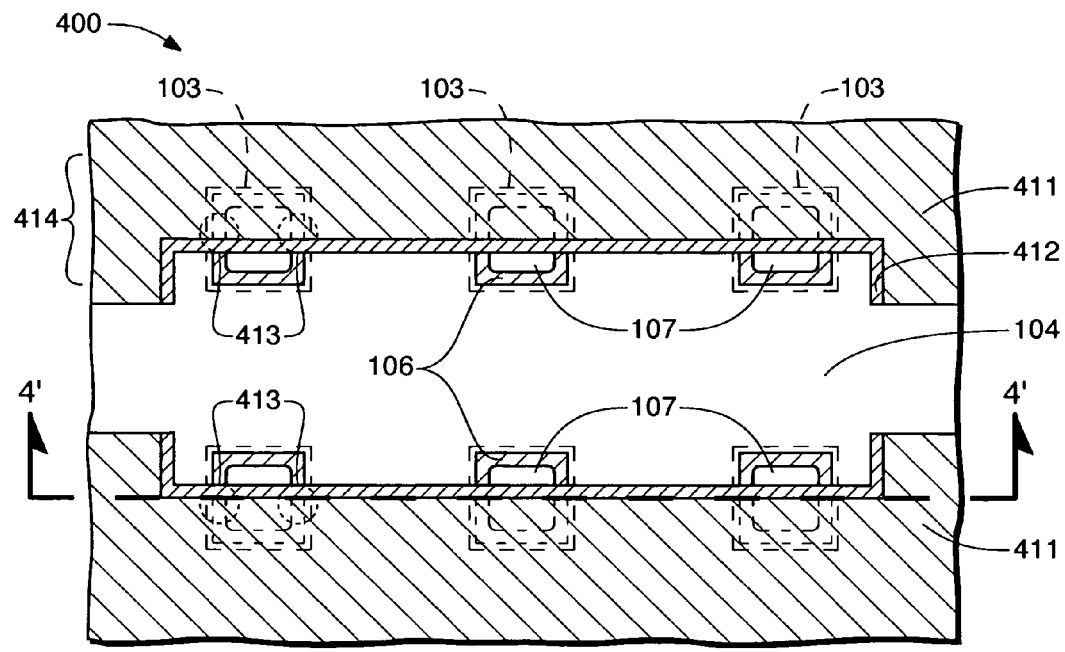
FIG. 35 and FIG. 36, a top-down view and a corresponding cross sectional view in reference to FIG. 33 and FIG. 34, respectively, showing the substrate assembly after an optional step where the conductive layer is dry etched to isolate the top and bottom rows phase change cells.

FIG. 35 and FIG. 36, a top-down view and a corresponding cross sectional view (taken through line 4'-4' of FIG. 35) in reference to FIG. 33, and FIG. 34, respectively, showing the substrate assembly 400 after an optional step where the segments of conductive layer 411 and the underlying phase change material 412 is dry etched to separate the top and bottom segment into separate phase change cells 414 and 415.

As previously formed during the phase change liner formation, ultra-small contacts 413 are determined by the intersection of the sidewall bottom electrode 106 and the sidewall of the phase change liner 412. Since both materials used to form the bottom electrode and phase change liner may be as thin as 100 A or less, the effective contact area can be reduced down to 100 nm$^2$ or less, which is far smaller than other bottom electrode configurations currently used in industry. The current minimum contact area of plug bottom electrodes fabricated with spacer formation techniques is reported to be around 2000 nm$^2$. The phase change memory device is then completed using conventional fabrication techniques.

Thus, the fourth exemplary implementation of the present invention provides a significant fabrication advantage gained by the reduced contact area which allows for future phase change memory devices to be significantly scaled down in die size.

Each exemplary implementation of the present invention may use phase changes materials, such as GeTe, InSe, Sb$_2$Te$_3$, GaSb, InSb, AsTe, AlTe, GeSbTe, TeGeAs, InSbTe, TeSnSe, GeSeGa, BiSeSb, GaSeTe, SnSbTe, InSbGe, TeGeSbS, TeGeSnO, TeGeSnAu, PbTeGeSn, InSeTiCo, GeSbTePd, GeSbTeCo, SbTeBiSe, AgInSbTe, GeSb(SeTe), (GeSn)SbTe, GeTeSnNi, GeTeSnPd, GeTeSnPt, In$_2$Se$_3$, GexSbyTez, SnSb$_2$Te$_4$, or other phase change material compounds with different compositions.

FIG. 37 represents a system used to employ any one of the exemplary implementations of the present invention. Referring to FIG. 37, a processor system 900, which can be any system including one or more processors, for example, a computer system, generally comprises a central processing unit (CPU) 902, such as a microprocessor, a digital signal processor, or any other programmable digital logic devices, which communicates with an input/output (I/O) device 906 over a bus 904. The memory circuit 901 communicates with the CPU 902 over bus 904 typically through a memory controller.

In the case of a computer system, the processor system 900 may include peripheral devices such as a compact disc (CD) ROM drive or hard drive 910, which also communicate with CPU 902 and hard drive 910 over bus 904. Memory circuit 901 is preferably constructed as an integrated circuit, which includes a memory array 903 having at least one phase change memory element 911 according to the invention. If desired, the memory circuit 901 may be combined with the processor, for example CPU 900, in a single integrated circuit.

It is to be understood that although the present invention has been described with reference to at least one preferred embodiment, various modifications, known to those skilled in the art may be made to the process steps presented herein without departing from the invention as recited in the several claims appended hereto.

What is claimed is:

1. A method for forming a bottom electrode contact structure for a phase change memory device comprising:
    forming conductive plugs;
    forming a first dielectric material on top of the conductive plugs;
    forming openings into the dielectric material to expose the conductive plugs;
    forming conformal conductive liners in the openings of the first dielectric material to make contact to the conductive plugs and line the sidewalls of each opening, the conformal conductive liners forming conductive liner bottom electrodes of a phase change cell;
    filling the lined openings with a second dielectric material;
    forming a third dielectric material over the filled lined openings;
    forming a conductive layer on the third dielectric material;
    patterning and etching the third dielectric material and the conductive layer to form a patterned stack of dielectric material and conductive material that covers a plurality of rows of bottom electrodes, wherein at least one patterned sidewall of the patterned stack of dielectric material and conductive material laterally bisects a row of bottom electrodes as viewed from a top view; and
    forming a phase change material liner on at least one patterned sidewalls of the patterned stack of the dielectric material and the conductive layer, wherein the phase change material liner contacts each bisected bottom electrode in at least two locations.

2. The method of claim 1, further comprising selecting the phase change material from the group consisting essentially of GeTe, InSe, Sb$_2$Te$_3$, GaSb, InSb, AsTe, AlTe, GeSbTe, TeGeAs, InSbTe, TeSnSe, GeSeGa, BiSeSb, GaSeTe, SnSbTe, InSbGe, TeGeSbS, TeGeSnO, TeGeSnAu, PbTeGeSn, InSeTiCo, GeSbTePd, GeSbTeCo, SbTeBiSe, AgInSbTe, GeSb(SeTe), (GeSn)SbTe, GeTeSnNi, GeTeSnPd, GeTeSnPt, In$_2$Se$_3$, GexSbyTez, and SnSb$_2$Te$_4$.

3. A method for forming a plurality of phase change memory structures comprising:
    forming adjacent rows of a plurality of isolated conductive liner bottom electrode structures, each being a walled structure having conductive walls surrounding a dielectric filler, wherein the conductive bottom electrode structures have a general u-shape vertical cross-section;
    depositing a dielectric material above the walled structures;
    depositing a metal-one layer on top of the layer of dielectric material;
    patterning the dielectric material and the metal-one layer to form a plurality of patterned stacks of the dielectric material and the metal-one layer, each stack overlying two adjacent rows of the isolated conductive liner bottom electrode structures and covering half the walled structures such that an edge of the patterned stacks bisects the walled structures in a top view;
    depositing a conformal phase change material on the patterned stacks of the dielectric material and the metal-one layer;
    etching the phase change material to form a phase change material liner on the sidewalls of each patterned stack of the dielectric material and the metal-one layer, such that the phase change material liner contacts each bottom electrode at a top surface of two of the bisected conductive walls;

etching each patterned stack of the dielectric material, the metal-one layer and the phase change liner to isolate a first portion of the stack from a second portion of the stack and form two adjacent rows of phase change cells.

4. The method of claim 3, further comprising selecting the phase change material from the group consisting essentially of GeTe, InSe, $Sb_2Te_3$, GaSb, InSb, AsTe, AlTe, GeSbTe, TeGeAs, InSbTe, TeSnSe, GeSeGa, BiSeSb, GaSeTe, SnSbTe, InSbGe, TeGeSbS, TeGeSnO, TeGeSnAu, PbTeGeSn, InSeTiCo, GeSbTePd, GeSbTeCo, SbTeBiSe, AgInSbTe, GeSb(SeTe), (GeSn)SbTe, GeTeSnNi, GeTeSnPd, GeTeSnPt, $In_2Se_3$, GexSbyTez, and $SnSb_2Te_4$.

5. A method for forming a bottom electrode contact structure for a phase change memory device comprising:

forming a bottom electrode structure having a bottom and sidewalls upwardly extending from the bottom such that the bottom electrode has a general u-shape vertical cross-section;

forming a patterned stack of conductive and dielectric material above the bottom electrode, wherein a patterned vertical edge of the stack horizontally bisects a top region of two sidewalls of the bottom electrode; and forming a phase change material spacer on the vertical edge of the stack such that the phase change material spacer contacts an edge of the conductive material of the stack and contacts a top surface of the two sidewalls of the bottom electrode, such that a surface contact area between the bottom electrode and the phase change material is dependant upon a thickness of the bottom electrode sidewalls and a thickness of the phase change material spacer.

6. The method of claim 5, further comprising selecting the phase change material from the group consisting essentially of GeTe, InSe, $Sb_2Te_3$, GaSb, InSb, AsTe, AlTe, GeSbTe, TeGeAs, InSbTe, TeSnSe, GeSeGa, BiSeSb, GaSeTe, SnSbTe, InSbGe, TeGeSbS, TeGeSnO, TeGeSnAu, PbTeGeSn, InSeTiCo, GeSbTePd, GeSbTeCo, SbTeBiSe, AgInSbTe, GeSb(SeTe), (GeSn)SbTe, GeTeSnNi, GeTeSnPd, GeTeSnPt, $In_2Se_3$, GexSbyTez, and $SnSb_2Te_4$.

* * * * *